(12) United States Patent
You et al.

(10) Patent No.: US 12,040,401 B2
(45) Date of Patent: *Jul. 16, 2024

(54) SEMICONDUCTOR DEVICE

(71) Applicant: SAMSUNG ELECTRONICS CO., LTD., Suwon-si (KR)

(72) Inventors: Junggun You, Ansan-si (KR); Joohee Jung, Seoul (KR); Jaehyeoung Ma, Seongnam-si (KR); Namhyun Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/994,565

(22) Filed: Nov. 28, 2022

(65) Prior Publication Data

US 2023/0087731 A1  Mar. 23, 2023

Related U.S. Application Data

(63) Continuation of application No. 17/205,282, filed on Mar. 18, 2021, now Pat. No. 11,515,421.

(30) Foreign Application Priority Data

Jul. 30, 2020 (KR) .................. 10-2020-0095190

(51) Int. Cl.
*H01L 29/78* (2006.01)
*H01L 27/088* (2006.01)
(Continued)

(52) U.S. Cl.
CPC ........ *H01L 29/785* (2013.01); *H01L 27/0886* (2013.01); *H01L 29/0653* (2013.01); *H01L 29/1033* (2013.01); *H01L 29/42392* (2013.01); *H01L 2029/7858* (2013.01)

(58) Field of Classification Search
CPC ............... H01L 29/785; H01L 29/0653; H01L 29/42392; H01L 29/775; H01L 29/7853;
(Continued)

(56) References Cited

U.S. PATENT DOCUMENTS 9,053,947 B2  6/2015  Hu et al.
9,385,195 B1  7/2016  Zhang
(Continued)

FOREIGN PATENT DOCUMENTS

KR  10-2019-0058962 A  5/2019

*Primary Examiner* — Changhyun Yi
(74) *Attorney, Agent, or Firm* — Fish & Richardson P.C.

(57) ABSTRACT

A semiconductor device including a substrate having a central region and a peripheral region; an integrated circuit structure on the central region; and a first structure on the peripheral region and surrounding the central region, wherein a portion of the first structure includes a first fin structure defined by a device isolation region in the substrate; a first dielectric layer covering an upper surface and side surfaces of the first fin structure and an upper surface of the device isolation region; a first gate structure on the first fin structure, the first gate structure including a first gate conductive layer, a first gate dielectric layer covering lower and side surfaces of the first gate conductive layer, and first gate spacer layers on side walls of the first gate conductive layer; and a first insulating structure covering the first dielectric layer and the first gate structure.

20 Claims, 47 Drawing Sheets

(51) Int. Cl.
*H01L 29/06* (2006.01)
*H01L 29/10* (2006.01)
*H01L 29/423* (2006.01)

(58) Field of Classification Search
CPC ............ H01L 27/0886; H01L 29/1033; H01L 2029/7858; H01L 21/823431; H01L 21/823437; H01L 21/823481; H01L 27/088; H01L 29/66439; H01L 29/0673; H01L 29/78696
See application file for complete search history.

(56) References Cited

U.S. PATENT DOCUMENTS

| | | |
|---|---|---|
| 9,437,739 B2 | 9/2016 | Yu et al. |
| 9,679,896 B2 | 6/2017 | Yoon et al. |
| 11,515,421 B2 * | 11/2022 | You ................. H01L 21/823431 |
| 2013/0270512 A1 | 10/2013 | Radosavljevic et al. |
| 2014/0056060 A1 | 2/2014 | Khvalkovskiy et al. |
| 2014/0056061 A1 | 2/2014 | Khvalkovskiy et al. |
| 2014/0367835 A1 | 12/2014 | Wei et al. |
| 2016/0118480 A1 | 4/2016 | Xie et al. |
| 2016/0172359 A1 * | 6/2016 | Yoon ..................... H01L 29/402 |
| | | 257/401 |
| 2019/0157150 A1 | 5/2019 | Park et al. |
| 2019/0371743 A1 | 12/2019 | Then et al. |
| 2020/0044017 A1 | 2/2020 | Tanaka |
| 2021/0391466 A1 * | 12/2021 | Yeong ............... H01L 29/66439 |
| 2022/0037509 A1 * | 2/2022 | Huang ................ H01L 27/0886 |
| 2022/0352370 A1 * | 11/2022 | Chen .................... H01L 29/785 |

* cited by examiner

SEMICONDUCTOR DEVICE

CROSS-REFERENCE TO RELATED APPLICATIONS

This is a continuation application based on pending application Ser. No. 17/205,282, filed Mar. 18, 2021, the entire contents of which is hereby incorporated by reference.

Korean Patent Application No. 10-2020-0095190, filed on Jul. 30, 2020, in the Korean Intellectual Property Office, and entitled: "Semiconductor Device," is incorporated by reference herein in its entirety.

BACKGROUND

1. Field

Embodiments relate to a semiconductor device.

2. Description of the Related Art

A plurality of semiconductor devices may be on a semiconductor wafer, and the wafers may be cut and separated to be individual integrated circuit devices, semiconductor chips.

SUMMARY

The embodiments may be realized by providing a semiconductor device including a substrate having a central region and a peripheral region surrounding the central region; an integrated circuit structure on the central region of the substrate; and at least one first structure on the peripheral region of the substrate and surrounding the central region of the substrate, wherein a portion of the at least one first structure includes a first fin structure defined by a device isolation region in the substrate and protruding from the substrate; a first dielectric layer covering an upper surface and side surfaces of the first fin structure and an upper surface of the device isolation region; a first gate structure on the first fin structure, the first gate structure including a first gate conductive layer, a first gate dielectric layer covering a lower surface and side surfaces of the first gate conductive layer, and first gate spacer layers on both side walls of the first gate conductive layer; and a first insulating structure covering the first dielectric layer and the first gate structure, the first fin structure includes a first fin line portion having a linear shape and extending in a first direction, the first gate conductive layer of the first gate structure includes a first gate line portion having a linear shape and extending in the first direction, the first fin line portion has a first width in a second direction perpendicular to the first direction, and the first gate line portion has a second width in the second direction, the second width being narrower than the first width.

The embodiments may be realized by providing a semiconductor device including a substrate having a central region and a peripheral region surrounding the central region; an integrated circuit structure on the central region of the substrate; and a first structure surrounding the central region on the peripheral region of the substrate, wherein a portion of the first structure includes a first fin structure protruding further than a device isolation region disposed in the substrate and extending in a first direction; a first dielectric layer covering the device isolation region and the first fin structure; and a first gate conductive layer extending in the first direction on the first fin structure, the first fin structure has a first side surface and a second side surface opposing each other in a second direction perpendicular to the first direction in which the first fin structure and the first gate conductive layer extend, the first gate conductive layer has a third side surface and a fourth side surface opposing each other in the second direction, the first dielectric layer covers the first side surface and the second side surface of the first fin structure, and a portion of at least one of the first and second side surfaces is side by side with a portion of at least one of the third and fourth side surfaces.

The embodiments may be realized by providing a semiconductor device including a substrate having a central region and a peripheral region surrounding the central region; a plurality of transistors on the central region of the substrate, the plurality of transistors including circuit fin patterns, a circuit gate structure, and source/drain regions; and a plurality of first structures on the peripheral region of the substrate, wherein a portion of each first structure of the plurality of first structures includes a first fin structure having a linear shape, defined by a device isolation region in the substrate, and extending in a first direction, and a first gate conductive layer having a linear shape and extending in the first direction on the first fin structure, a first distance between opposing side surfaces of the first fin structures adjacent to each other is less than a second distance between opposing side surfaces of the first gate conductive layers adjacent to each other in a second direction perpendicular to the first direction.

BRIEF DESCRIPTION OF DRAWINGS

Features will be apparent to those of skill in the art by describing in detail exemplary embodiments with reference to the attached drawings in which.

DETAILED DESCRIPTION

A semiconductor device of an example embodiment will be described with reference to FIGS. 1 to 3B.

Figure 1:
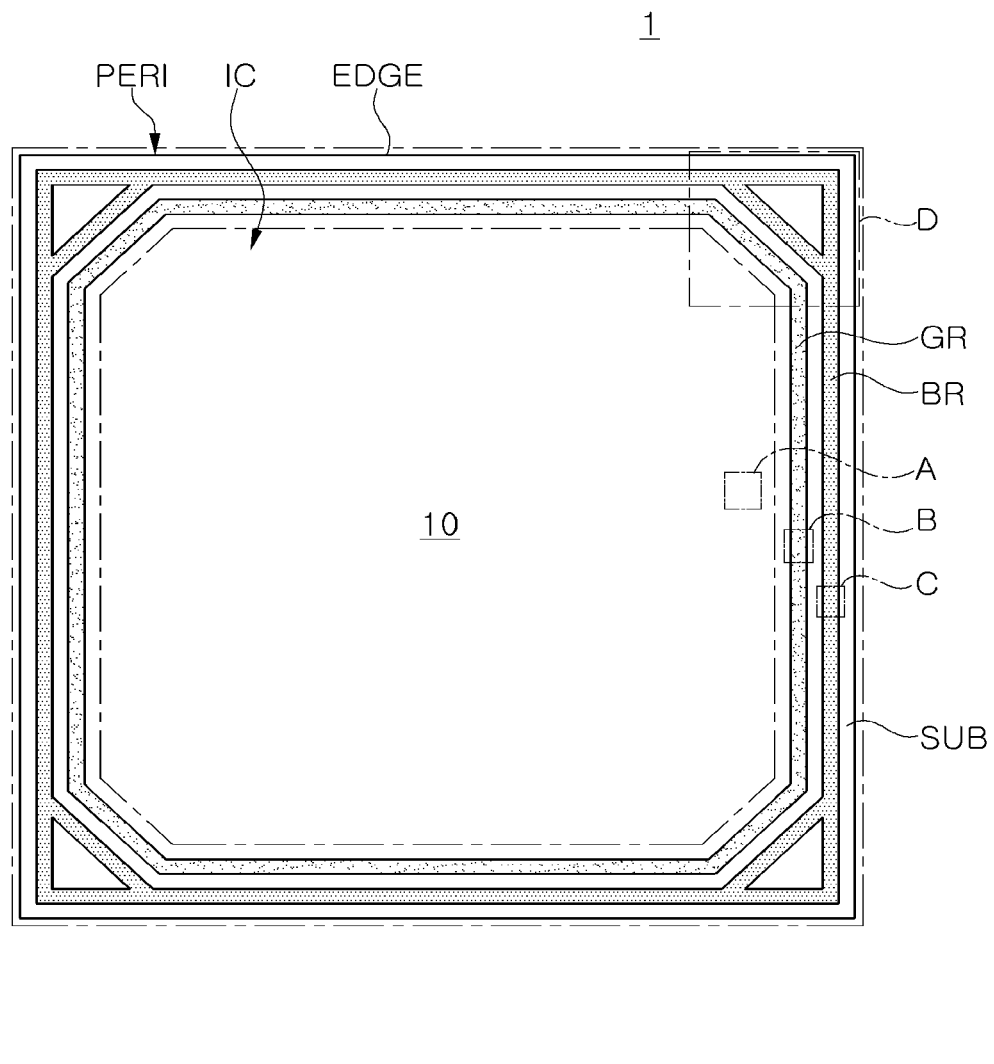
FIG. 1 is a plan diagram of a semiconductor device according to an example embodiment of the present disclosure.

FIG. 1 is a plan view of a semiconductor device according to an example embodiment.

Figure 2A:
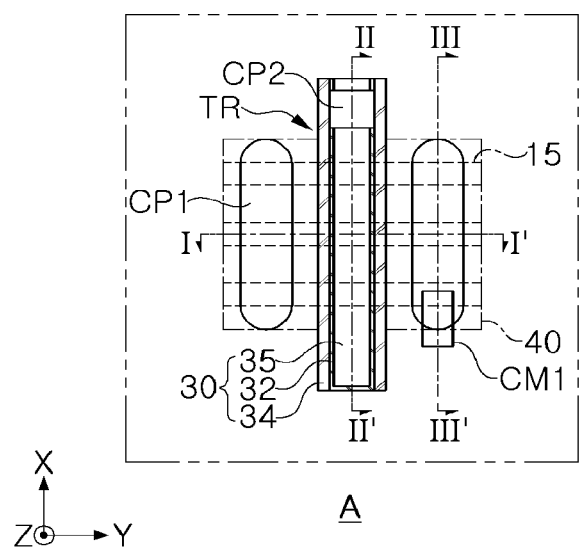
FIG. 2A is an enlarged plan view of a portion of a region of an example of a semiconductor device.
Figure 2B:
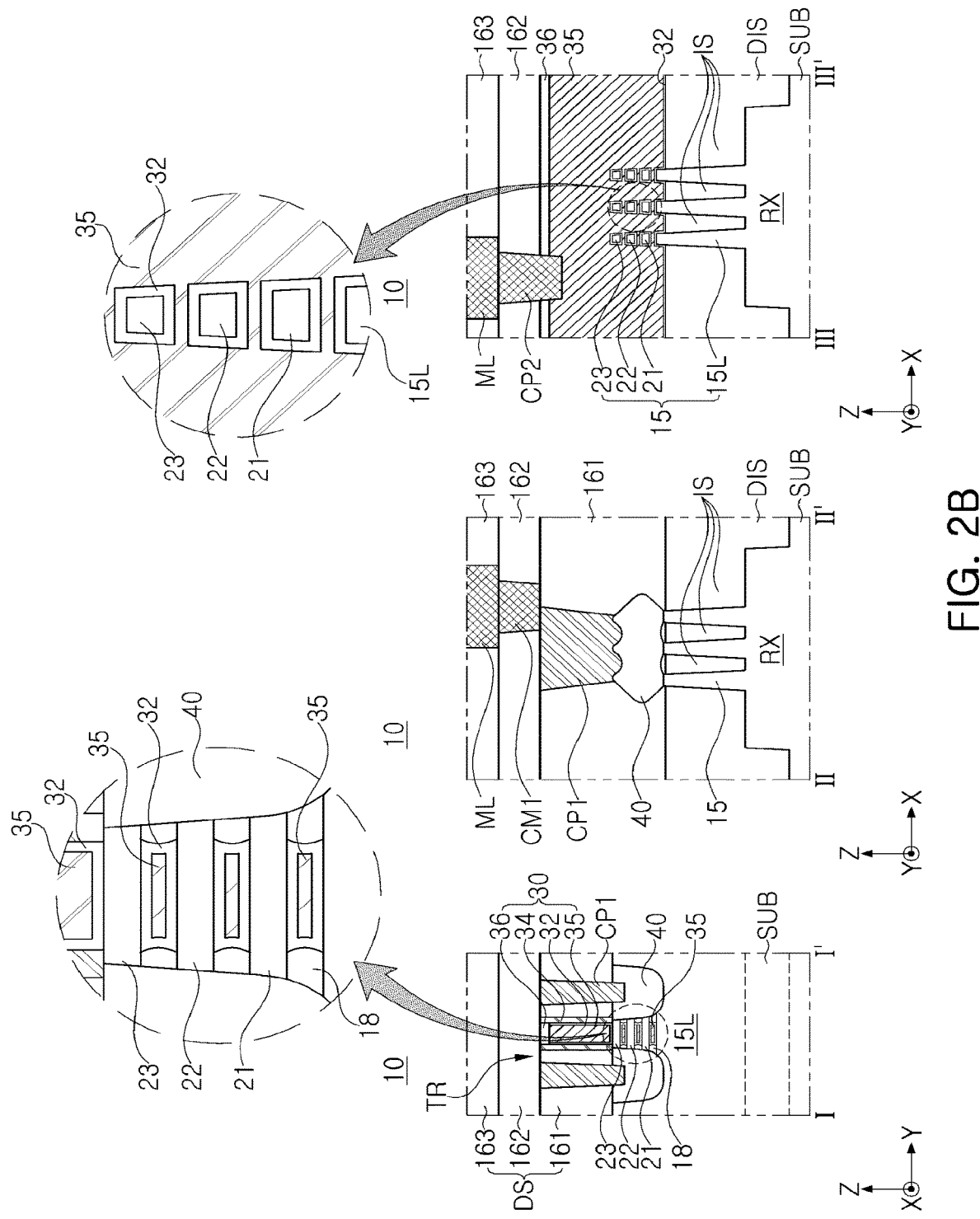
FIG. 2B is a cross-sectional view of a semiconductor device according to an example embodiment of the present disclosure.
Figure 2C:
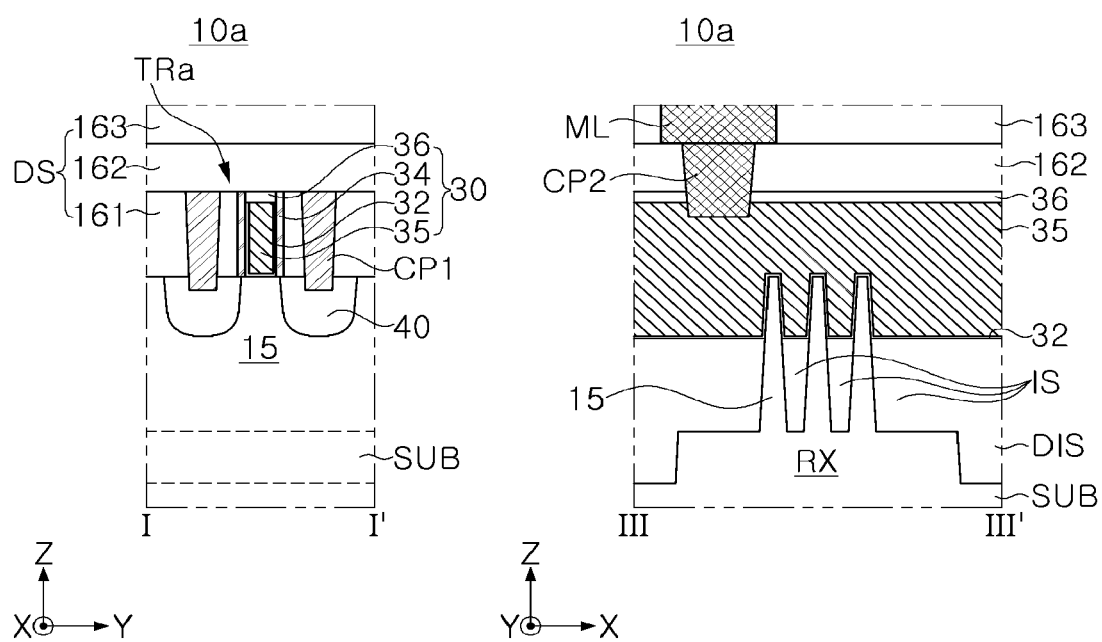
FIG. 2C is a cross-sectional view of a semiconductor device according to an example embodiment of the present disclosure.

FIG. 2A is an enlarged plan view of region "A" illustrated in FIG. 1. FIG. 2B illustrates cross-sectional views taken along lines I-I', and in FIG. 2A. FIG. 2C illustrates cross-sectional views taken along lines I-I' and in FIG. 2B.

Figure 3A:
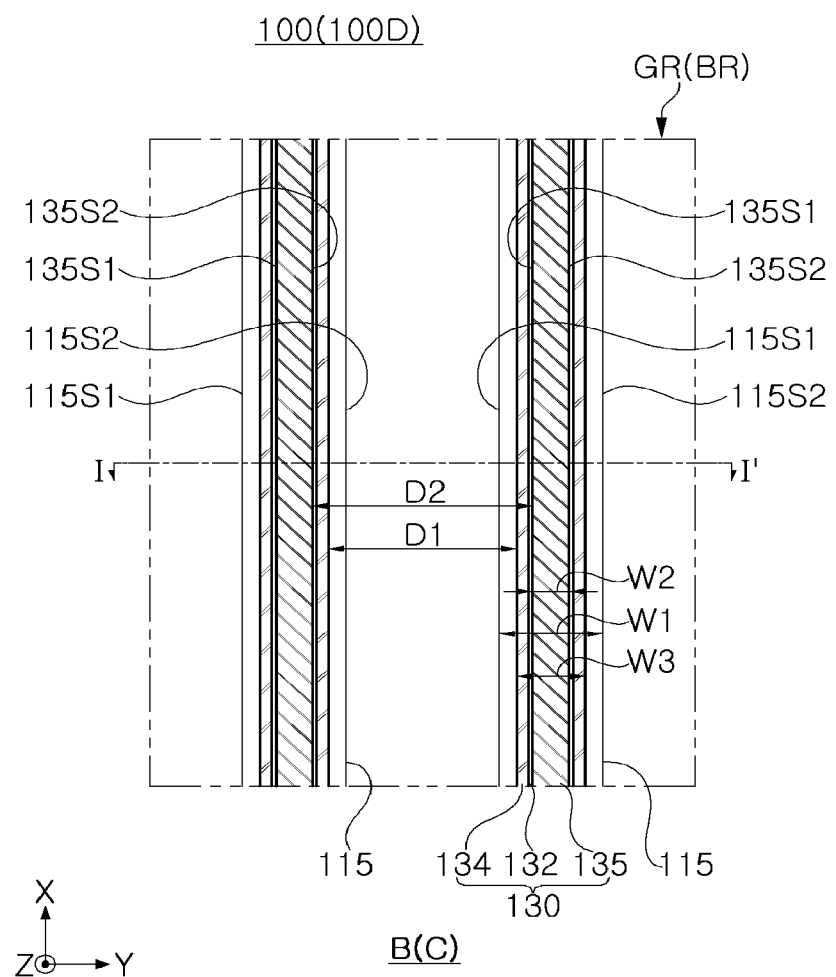
FIG. 3A is an enlarged plan view of a portion of a region of an example of a semiconductor device.
Figure 3B:
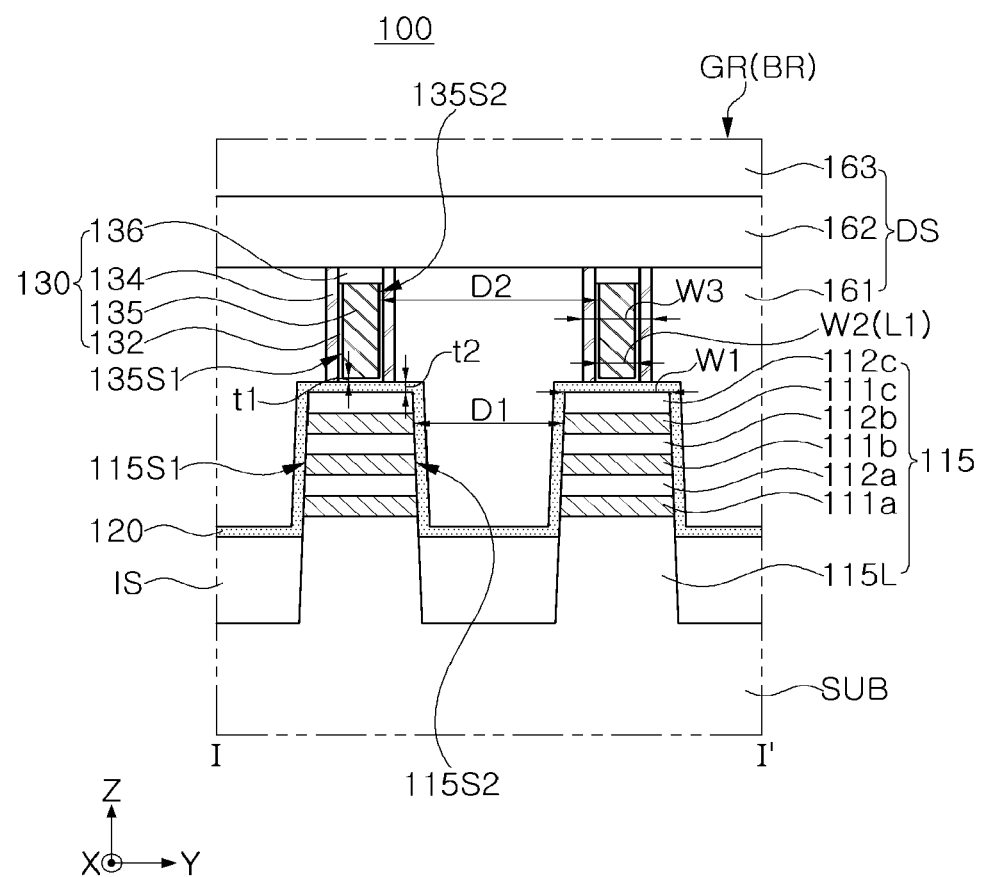
FIGS. 3B to 3F are cross-sectional views of a semiconductor device according to an example embodiment of the present disclosure.

FIG. 3A is an enlarged plan view of region "B" or region "C" illustrated in FIG. 1. FIG. 3B is a cross-sectional view taken along line I-I' in FIG. 3A.

Referring to FIGS. 1 to 3B, a semiconductor device 1 may include a substrate SUB having a central region IC and a peripheral region PERI, an integrated circuit structure 10 in or on the central region IC of the substrate SUB, and first structures 100 on the peripheral region PERI of the substrate SUB. An insulating structure DS including a plurality of insulating layers may be on the substrate SUB.

The substrate SUB may include a semiconductor material, such as a group IV semiconductor, a group III-V compound semiconductor, or a group II-VI compound semiconductor. In an example embodiment, the group IV semiconductor may include silicon (Si), germanium (Ge), or silicon germanium (SiGe). The substrate SUB may be provided as a bulk wafer, a silicon on insulator (SOI) layer, a semiconductor on insulator (SeOI) layer, or the like. As used herein, the term "or" is not an exclusive term, e.g., "A or B" would include A, B, or A and B.

The peripheral region PERI of the substrate SUB may surround the central region IC. The peripheral region PERI may include an edge portion EDGE of the substrate SUB. The edge portion EDGE of the semiconductor device 1 may be formed in a process of isolating a plurality of semiconductor devices on a semiconductor wafer.

The peripheral region PERI of the substrate SUB may include a guard-ring region GR and a blocking region BR. The guard-ring region GR may surround the central region IC. The blocking region BR may surround the guard-ring region GR. The blocking region BR may be closer to the edge portion EDGE of the semiconductor device 1 than the guard-ring region GR is the edge portion EDGE of the semiconductor device 1. The guard-ring region GR and the blocking region BR may be regions in which a moisture oxidation barrier structure and/or a crack stop structure are disposed.

In an example embodiment, corners of the guard-ring region GR or the blocking region BR may have a curved shape. In an example embodiment, a shape of the corners of the guard-ring region GR or the blocking region BR may have any shape as long as the corner may surround the central region IC. The corners of the guard-ring region GR or the blocking region BR will be described in greater detail with reference to FIG. 14, an enlarged view of region "D" illustrated in FIG. 1.

The integrated circuit structure 10 in the central region IC of the substrate SUB will be described with reference to FIGS. 2A to 2C.

The integrated circuit structure 10 may include a device isolation region IS in or on the substrate SUB, a plurality of transistors TR, an insulating structure DS, a plurality of circuit contact structures CP1 and CP2, and a plurality of wirings ML.

Each of the plurality of transistors TR may include circuit fin patterns 15 defined by the device isolation region IS, circuit gate structure 30 intersecting the circuit fin patterns 15, and source/drain regions 40 on the circuit fin patterns 15 adjacent to side surfaces of the circuit gate structure 30.

The plurality of transistors TR of the integrated circuit structure 10 illustrated in FIG. 2B may be configured as a multi-bridge channel FET (MBCFET™) in which the circuit fin patterns 15 include a circuit lower semiconductor region 15L, and a plurality of channel layers 21, 22, and 23 disposed on the circuit lower semiconductor region 15L and spaced apart from each other in a vertical direction (Z).

The circuit fin patterns 15 may have a fin structure, and may be defined by the device isolation region IS in the substrate SUB. The circuit fin patterns 15 may have a structure protruding from the substrate SUB. The upper ends of the circuit fin patterns 15 may protrude from an upper surface of the device isolation region IS to a predetermined height (e.g., in a vertical Z direction).

The lower semiconductor region 15L of the circuit fin patterns 15 may extend from the substrate SUB in the vertical direction (Z). The plurality of channel layers 21, 22, and 23 may include a first channel layer 21, a second channel layer 22, and a third channel layer 23. The plurality of channel layers 21, 22, and 23 may be formed of a semiconductor material, and may include, e.g., silicon, silicon germanium, or germanium.

The device isolation region IS may define the circuit fin patterns 15 on the substrate SUB. The device isolation region IS may be formed by, e.g., a shallow trench isolation (STI) process. The device isolation region IS may be formed of an insulating material. The device isolation region IS may be, e.g., an oxide, a nitride, or a combination thereof.

In an example embodiment, the device isolation region IS may include a deep device isolation region DIS, and the deep device isolation region DIS may define a circuit active region RX. The circuit fin patterns 15 may be on the circuit active region RX. The circuit active region RX may be understood as a component including the circuit fin patterns 15.

The source/drain regions 40 may be between the circuit fin patterns 15 and the first circuit contact structures CP1. The source/drain regions 40 may be provided as a source region or a drain region of a transistor. The source/drain regions 40 may be recessed into the upper portions of the circuit fin patterns 15, e.g., whether the source/drain regions 40 are recessed and the recessed depth may be varied.

The source/drain regions 40 may be configured as a semiconductor layer including silicon and may be configured as an epitaxial layer. The source/drain regions 40 may include impurities of different types and/or concentrations. In an example embodiment, the source/drain regions 40 may include n-type doped silicon and/or p-type doped silicon germanium.

In an example embodiment, the source/drain regions 40 may include a plurality of regions including elements of different concentrations and/or doping elements.

The circuit gate structure 30 may be above the circuit fin patterns 15, may cross the circuit fin patterns 15, and may extend (e.g., lengthwise) in one direction. Channel regions of transistors may be on the plurality of channel layers 21, 22, and 23 of the circuit fin patterns 15 intersecting with the circuit gate structure 30.

The circuit gate structure 30 may include a circuit gate electrode 35, a circuit gate dielectric layer 32 between the circuit gate electrode 35 and the circuit fin patterns 15, circuit gate spacer layers 34 on the side surfaces of the circuit gate electrode 35, and a circuit gate capping layer 36 on the circuit gate electrode 35.

The circuit gate dielectric layer 32 may surround all surfaces (other than an uppermost surface of the circuit gate electrode 35) on the third channel layer 23. The circuit gate dielectric layer 32 may include oxide, nitride, or a high-k material. The circuit gate dielectric layer 32 may be disposed among the first to third channel layers 21, 22, and 23.

The circuit gate electrode 35 may be above the circuit fin patterns 15 and may extend to intersect with the circuit fin patterns 15. The circuit gate electrode 35 may be between the circuit lower semiconductor region 15L and the first channel layer 21, between the first channel layer 21 and the second channel layer 22, between the second channel layer 22 and the third channel layer 23, and on the upper surface of the third channel layer 23.

The circuit gate electrode 35 may include a conductive material, e.g., a metal nitride such as a titanium nitride film (TiN), a tantalum nitride film (TaN), or a tungsten nitride film (WN), a metal material such as aluminum (Al), tungsten (W), or molybdenum (Mo), or a semiconductor material such as a doped polysilicon. The circuit gate electrode 35 may include two or more layers.

In an example embodiment, the circuit gate spacer layer 34 may have a multilayer structure. The circuit gate spacer layer 34 may be formed of oxide, nitride and oxynitride, and may also be formed of a low-k film.

The circuit gate capping layer 36 may be above the circuit gate electrode 35. The circuit gate capping layer 36 may be formed of oxide, nitride, or oxynitride.

Internal spacer layers 18 may be further disposed in the plurality of transistors TR. In an example embodiment, the internal spacer layers 18 may be on both sides of the circuit gate electrode 35 taken in the second direction (Y), on the lower surfaces of the first to third channel layers 21, 22, and 23. The internal spacer layers 18 may be formed of oxide, nitride, and oxynitride, and may be formed of a low-k film.

The insulating structure DS may cover the plurality of transistors TR. The insulating structure DS may include a first insulating layer 161, a second insulating layer 162, and a third insulating layer 163 stacked in order on the substrate SUB. The insulating structure DS may be disposed throughout an entire region on the substrate SUB. In the integrated circuit structure 10, the insulating structure DS may be referred to as a circuit region insulating structure.

The first circuit contact structures CP1 may be connected to the source/drain regions 40 and may apply an electric signal to the source/drain regions 40. Each of the second circuit contact structures CP2 may be connected to the circuit gate electrode 35.

A plurality of circuit contact structures CP1 and CP2 may include, e.g., a metal nitride such as a titanium nitride film (TiN), a tantalum nitride film (TaN) or a tungsten nitride film (WN), or a metal material such as aluminum (Al), copper (Cu), tungsten (W), cobalt (Co), ruthenium (Ru), molybdenum (Mo), or the like.

The first circuit contact structures CP1 may include a contact plug including a conductive material and a metal-semiconductor compound layer between the source/drain regions 40. The metal-semiconductor compound layer may include metal silicide, metal germanide, or metal silicide-germanide, where the metal is titanium (Ti), nickel (Ni), tantalum (Ta), cobalt (Co), or tungsten (W), and the semiconductor may be silicon (Si), germanium (Ge), or silicon germanium (SiGe).

The plurality of wirings ML may be connected to the plurality of circuit contact structures CP1 and CP2, respectively, and may be electrically connected to the source/drain regions 40 or the circuit gate electrode 35 of the transistor, respectively. The plurality of wirings ML may extend (e.g., lengthwise) in one direction.

The plurality of wirings ML may include, e.g., a metal nitride such as a titanium nitride film (TiN), a tantalum nitride film (TaN) or a tungsten nitride film (WN), or a metal material such as aluminum (Al), copper (Cu), tungsten (W), cobalt (Co), ruthenium (Ru), molybdenum (Mo), or the like.

The plurality of transistors TRa illustrated in FIG. 2C may be configured as transistors, FinFETs, in which a channel region of a transistor may be formed in the circuit fin patterns 15 intersecting with the circuit gate structure 30. Each of the circuit fin patterns 15 may have a single fin structure.

The integrated circuit structure 10 on the central region IC of the substrate SUB may include the MBCFET™ illustrated in FIG. 2B or the FinFET illustrated in FIG. 2C.

In the description below, the first structures 100 which may be on the guard-ring region GR or the blocking region BR of the peripheral region PERI of the substrate SUB will be described with reference to FIGS. 3A and 3B.

The first structures 100 on the peripheral region PERI of the substrate SUB may protect the integrated circuit structure 10 on the central region IC.

During a process of cutting a wafer (in which a plurality of semiconductor devices on a semiconductor wafer are separated from each other), cracks could be created in an insulating layer between metals forming the semiconductor device 1. The cracks could propagate from the edge portion EDGE of the semiconductor device 1 to the integrated circuit structure 10 on the central region IC. Also, moisture could penetrate from a cut-out surface of the insulating layer between metals such that the integrated circuit structure 10 on the central region IC may be damaged.

The first structures 100 may include a moisture oxidation barrier structure or a crack stop structure surrounding the integrated circuit structure 10 on the central region IC.

The first structures 100 may help reduce or prevent the propagation of cracks created when the semiconductor wafer is cut, and may help reduce or prevent the integrated circuit structure 10 on the central region (IC) from being damaged by moisture or air permeated or penetrating from the outside.

At least a portion of the first structures 100 may help protect the integrated circuit structure 10 by blocking electrostatic current which could otherwise flow into the integrated circuit structure 10 on the central region IC.

Each of the first structures 100 may include a device isolation region IS, a first fin structure 115, a first dielectric layer 120, a first gate structure 130, and an insulating structure DS.

The first fin structure 115 may be defined by the device isolation region IS. The first fin structure 115 may include a first fin line portion having a linear shape and extending (e.g., lengthwise) in the first direction (X). The first fin structure 115 may have a shape protruding further upwardly than an upper surface of the device isolation region IS (e.g., in the vertical Z direction).

The first fin structure 115 may include a first lower semiconductor region 115L and stack structures 111a, 111b, 111c, 112a, 112b, and 112c on the first lower semiconductor region 115L. The first lower semiconductor region 115L may extend from the substrate SUB in the vertical direction (Z), and may be formed of the same material as a material of the substrate SUB. The stack structures 111a, 111b, 111c, 112a, 112b, and 112c may include a plurality of first layers 111a, 111b, and 111c and a plurality of second layers 112a, 112b, and 112c, alternately stacked.

The plurality of first layers 111a, 111b, and 111c may include a first silicon-germanium layer 111a, a second silicon-germanium layer 111b, and a third silicon-germanium layer 111c, spaced apart from each other in the vertical direction (Z). The first silicon-germanium layer 111a may be in contact with the first lower semiconductor region 115L.

The plurality of second layers 112a, 112b, and 112c may include a first silicon layer 112a, a second silicon layer 112b, and a third silicon layer 112c spaced apart from each other in the vertical direction (Z). The first silicon layer 112a may be between the first silicon-germanium layer 111a and the second silicon-germanium layer 111b, the second silicon layer 112b may be between the second silicon-germanium layer 111b and the third silicon-germanium layer 111c, and the third silicon layer 112c may be on the upper surface of the third silicon-germanium layer 111c.

In an example embodiment, the first fin structure 115 may include a first pattern portion overlapping the first gate structure 130 in the vertical direction (Z) and second pattern portion overlapping the first insulating layer 161 of the insulating structure DS in the vertical direction (Z). The side surface of the second pattern portion may be directly in contact with the first dielectric layer 120 and the device isolation region IS. In an example embodiment, an upper portion of the second pattern portion may be directly in contact with the first dielectric layer 120, and a lower portion of the second pattern portion may be directly in contact with the device isolation region IS.

In an example embodiment, the first fin line portion of the first fin structure 115 may have a first width W1, e.g., in the second direction (Y). The first width W1 may be wider than a width of the circuit fin pattern 15 of the transistor TR of the integrated circuit structure 10 in the second direction (Y). In an example embodiment, the first width W1 may be wider than the width of each of the plurality of channel layers 21, 22, and 23 of the circuit fin pattern 15 in the second direction (Y).

In an example embodiment, the first width W1 of the first fin line portion of the first fin structure 115 in the second direction (Y) may be greater than the width of a first contact structure 140 in the second direction (Y).

In an example embodiment, the plurality of first layers 111a, 111b, and 111c may be first to third silicon layers, and the plurality of second layers 112a, 112b, 112c may be first to third silicon-germanium.

The first dielectric layer 120 may cover the device isolation region IS and the first fin structure 115. The first dielectric layer 120 may be in contact with an upper surface of the device isolation region IS, side surfaces of the first fin structure 115 (taken or facing in the second direction (Y)), and an upper surface of the first fin structure 115. The first dielectric layer 120 may cover side surfaces of the plurality of first layers 111a, 111b, and 111c and side surfaces of the plurality of second layers 112a, 112b, and 112c. The first dielectric layer 120 may be formed of silicon oxide.

In an example embodiment, the first dielectric layer 120 may be formed of an oxidation oxide or a deposition oxide. In an example embodiment, the forming the first dielectric layer 120 may include forming the first dielectric layer 120 using one or both of a method of forming a semiconductor layer covering the fin structure 115 and forming an oxidation oxide by oxidizing the semiconductor layer, and a method of forming a deposited oxide by performing a deposition process on the oxidation oxide.

In an example embodiment, the first dielectric layer 120 may have a second thickness t2 greater than a first thickness t1 of a first gate dielectric layer 132 of the first gate structure 130.

The first gate structure 130 may extend (e.g., lengthwise) in the first direction (X) on the upper surface of the first fin structure 115. The first gate structure 130 may include the first gate dielectric layer 132, a first gate conductive layer 135, a first gate capping layer 136, and first gate spacer layers 134.

The first gate dielectric layer 132 may be between the first gate conductive layer 135 and the first fin structure 115. The first gate dielectric layer 132 may be between the first gate conductive layer 135 and the first gate spacer layers 134. The first gate dielectric layer 132 may cover the lower surface and side surfaces of the first gate conductive layer 135. The first gate dielectric layer 132 may include oxide, nitride, or a high-k material.

In an example embodiment, the first gate dielectric layer 132 may include a high-k material having a dielectric constant higher than that of the first dielectric layer 120.

The first gate conductive layer 135 may be on the upper surface of the first fin structure 115. The first gate conductive layer 135 may include a first gate line portion extending in the first direction (X). The first gate conductive layer 135 may include a conductive material, e.g., a metal nitride such as a titanium nitride film (TiN), a tantalum nitride film (TaN), or tungsten nitride film (WN), a metal material such as aluminum (Al), tungsten (W), or molybdenum (Mo), or a semiconductor material such as doped polysilicon.

In an example embodiment, the first fin line portion of the first fin structure 115 may have the first width W1 in a second direction (Y), and the first gate line portion of the first gate conductive layer 135 may have a second width W2 in the second direction (Y), and the second width W2 may be narrower (e.g., smaller) than the first width W1.

The first width W1 may be a minimum width of the first fin structure 115 in the second direction (Y). The first width W1 may be a minimum width of the third silicon layer 112c in the second direction (Y). In an example embodiment, the first fin structure 115 may have inclined side surfaces each having a decreasing width as the distance from an upper surface of the substrate SUB increases along the vertical direction (Z), and the first width W1 of the first fin line portion of the first fin structure 115 may be a width of an upper end of the third silicon layer 112c in the second direction (Y) (e.g., a smallest distance between side walls of the first fin structure 115).

In an example embodiment, a third width W3 of the first gate structure 130 in the second direction (Y) may be narrower than the first width W1 of the first fin line portion of the first fin structure 115 in the second direction (Y).

In an example embodiment, the second width W2 of the first gate line portion of the first gate conductive layer 135 may be narrower than a width of each of the plurality of first layers 111a, 111b, and 111c in the second direction (Y).

In an example embodiment, the second width W2 of the first gate conductive layer 135 may be narrower than the width of each of the plurality of second layers 112a, 112b, and 112c in the second direction (Y).

In an example embodiment, the first fin structure 115 may have a first side surface 115S1 and a second side surface 115S2 opposing each other in or relative to the second direction (Y), and the first gate conductive layer 135 may have a third side surface 135S1 and a fourth side surface 135S2 opposing each other in or relative to the second direction (Y). A distance between the first side surface 115S1 and the second side surface 115S2 may be greater than a distance (L1) between the third side surface 135S1 and the fourth side surface 135S2 in the second direction (Y).

In a plan view, a portion of at least one of the first and second side surfaces 115S1 and 115S2 may be side by side with (e.g., may extend in parallel with) a portion of at least one of the third and fourth side surfaces 135S1 and 135S2. The first side surface 115S1 may include a first portion covered by the first dielectric layer 120 and a second portion covered by the device isolation region IS.

In an example embodiment, a first distance D1 between facing side surfaces of the first fin structures 115 adjacent to each other in the second direction (Y) may be narrower or less than a second distance D2 between facing side surfaces of the first gate conductive layers 135 adjacent to each other.

The first gate capping layer 136 may be on the first gate conductive layer 135. The first gate capping layer 136 may be partially recessed into the first gate conductive layer 135 or the first gate dielectric layer 132. Side surfaces of the first gate capping layer 136 may be surrounded by the first gate spacer layer 134. The first gate capping layer 136 may be formed of oxide, nitride, and oxynitride, e.g., SiO, SiN, SiCN, SiOC, SiON, or SiOCN.

The first gate spacer layer 134 may be on both sidewalls of the first gate conductive layer 135. The first gate spacer layer 134 may extend in the vertical direction (Z). The first gate spacer layer 134 may also extend in the first direction (X). The first gate spacer layer 134 may have a multilayer structure. The first gate spacer layer 134 may be formed of oxide, nitride, and oxynitride, and may be formed of a low-k film.

In an example embodiment, the distance L1 between opposing sides of the first gate spacer layers 134 on both sides of a single first gate conductive layer 135 (e.g., in the second direction Y) may be smaller than the first width W1 of the first fin structure 115.

The insulating structure DS may be on the first structure 100. The first insulating layer 161 of the insulating structure DS may cover the first dielectric layer 120 and the first gate structure 130. The second insulating layer 162 may be on the first insulating layer 161, and the third insulating layer 163 may be on the second insulating layer 162. In the first structure 100, the insulating structure DS may be referred to as a first insulating structure.

Figure 3C:
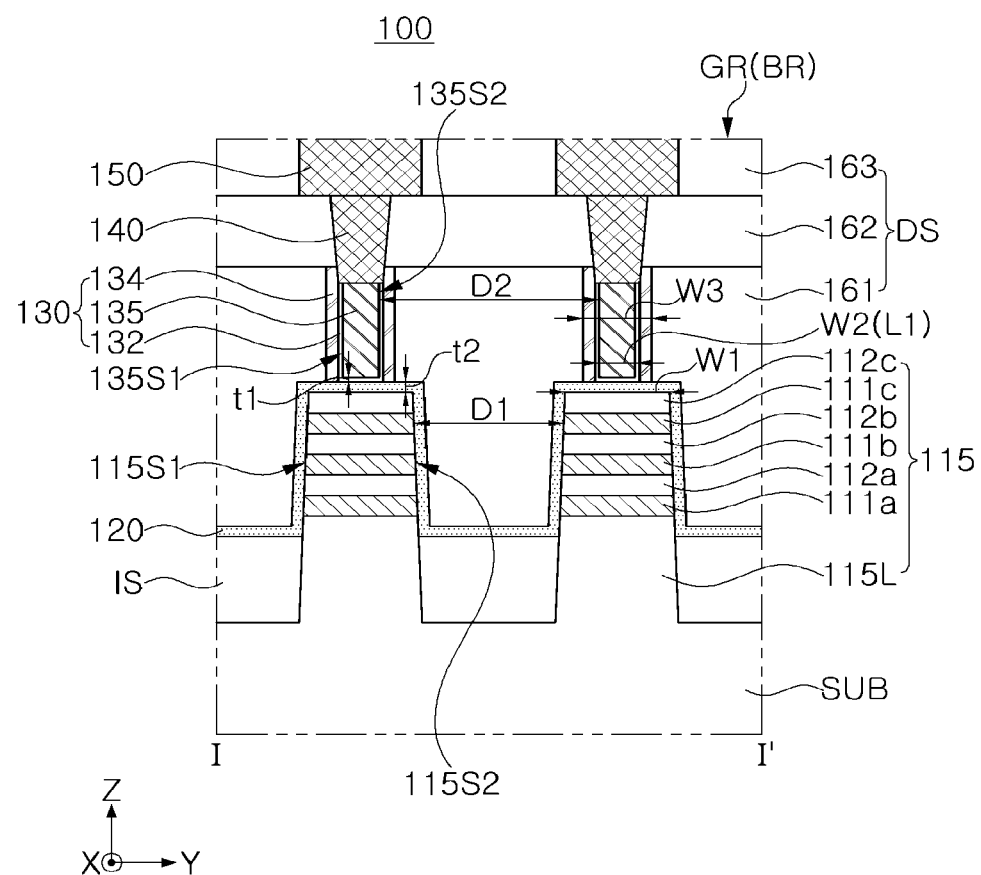

FIGS. 3B to 3F are cross-sectional views of a semiconductor device according to an example embodiment. FIG. 3C is a cross-sectional view of a semiconductor device viewed from a region different from FIG. 3B.

Referring to FIG. 3C, the first structure 100 of the semiconductor device 1 may further include the first contact structure 140 and a first wiring layer 150.

The first contact structure 140 may penetrate through the second insulating layer 162 and may be connected to the first gate conductive layer 135. The first contact structure 140 may be formed in the same process for forming the second circuit contact structure CP2 of the integrated circuit structure 10, and may have a structure the same as or similar to the structure of the second circuit contact structure CP2. The first contact structure 140 may include the above-described metal nitride or metal material. A portion of the first contact structure 140 may extend in one direction and may surround the central region IC of the substrate SUB.

The first wiring layer 150 may be in the third insulating layer 163. The first wiring layer 150 may be connected to the first contact structure 140. The first wiring layer 150 may extend in at least one direction. The first wiring layer 150 may be on the peripheral region PERI of the substrate SUB to surround the central region IC of the substrate SUB. The first wiring layer 150 may include the above-described metal nitride or metal material. The first wiring layer 150 may be formed in the same process for forming the plurality of wirings ML of the integrated circuit structure 10, and the first wiring layer 150 and the plurality of wirings ML may be on the same level from an upper surface of the substrate SUB.

In an example embodiment, a plurality of the first wiring layer 150 may be disposed and may extend side by side with each other. In an example embodiment, a plurality of vias and a plurality of wiring layers may be further disposed on the first wiring layer 150.

Figure 3D:
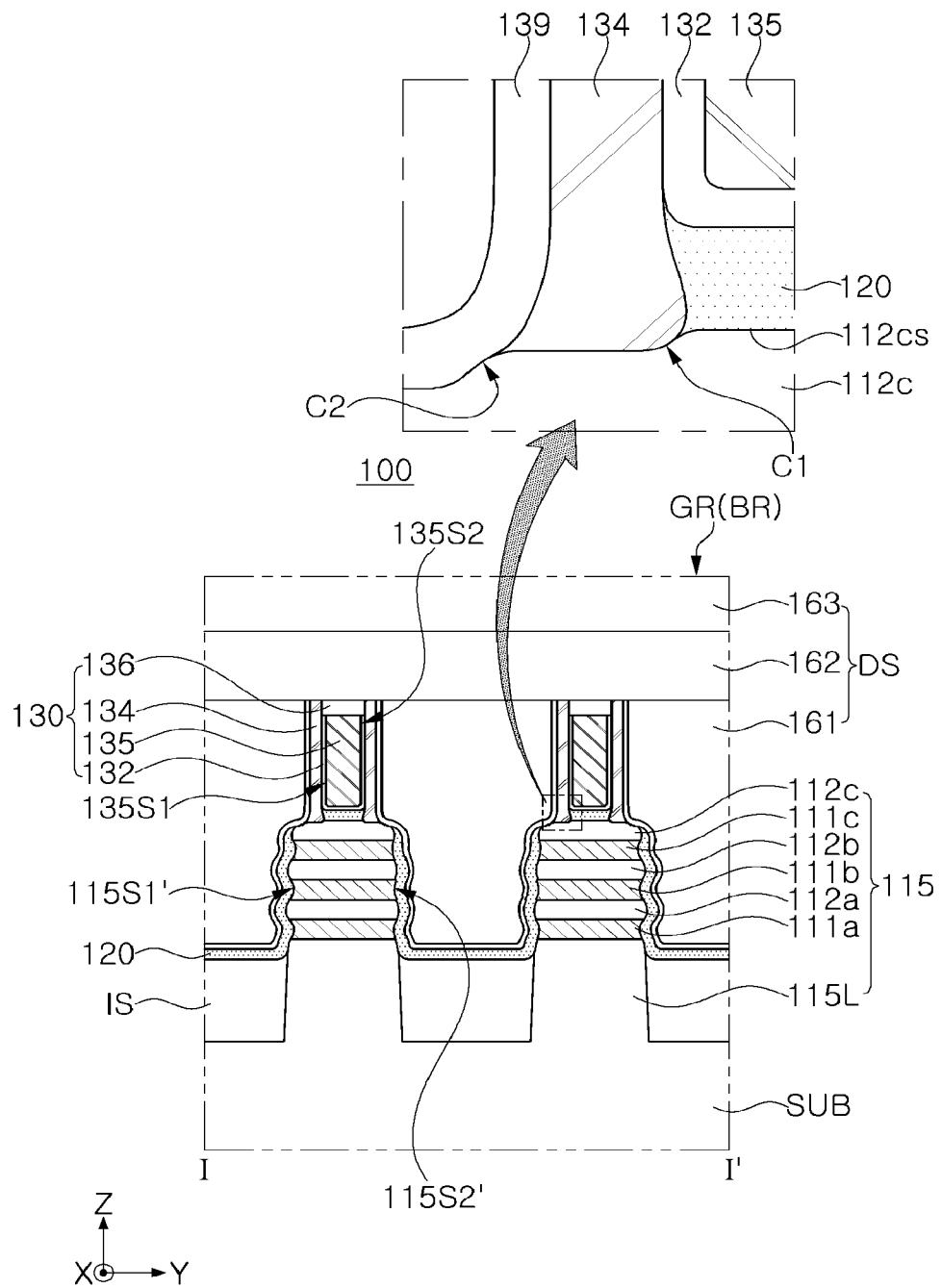

FIG. 3D is a cross-sectional view of a semiconductor device according to an example embodiment. FIG. 3C illustrates a region corresponding to FIG. 3B.

FIG. 3D illustrates a schematic shape of a first structure 100 of a semiconductor device 1. The first structure 100 may further include an etch stop layer 139 covering side surfaces of the first gate structure 130 and the first dielectric layer 120.

The plurality of first layers 111a, 111b, and 111c and the plurality of second layers 112a, 112b, and 112c may have bent or curved side surfaces. In an example embodiment, side surfaces of the plurality of first layers 111a, 111b, and 111c taken in the second direction (Y) may have an inwardly bent (e.g., inwardly curved, concaved or recessed) region, and side surfaces of the plurality of second layers 112a, 112b, and 112c in the second direction (Y) may have an outwardly bent (outwardly curved or convex) region.

In an example embodiment, the first side surface 115S1' and the second side surface 115S2' of the first fin structure 115 may have inwardly bent surfaces. The first dielectric layer 120 covering the first and second side surfaces 115S1' and 115S2' of the first fin structure 115 may also have a shape to conform to the inwardly bent surfaces of the first and second side surfaces 115S1' and 115S2'.

In an example embodiment, referring to the enlarged inset in FIG. 3D, the upper surface of the first fin structure 115 may include bent or curved portions C1 and C2. In an example embodiment, an upper surface 112Cs of the third silicon layer 112c on an uppermost portion of the plurality of second layers 112a, 112b, and 112c may include the bent portions C1 and C2. The bent portions C1 and C2 may include the first bent portion C1 in which the third silicon layer 112c is in contact with the first gate spacer layer 134, and the second bent portion C2 in which the third silicon layer 112c is in contact with the etch stop layer 139. The first bent portion C1 may be formed, e.g., in a process of etching a portion of the first dielectric layer 120, and the second bent portion C2 may be formed in an etching process for forming the first gate spacer layer 134.

Figure 3E:
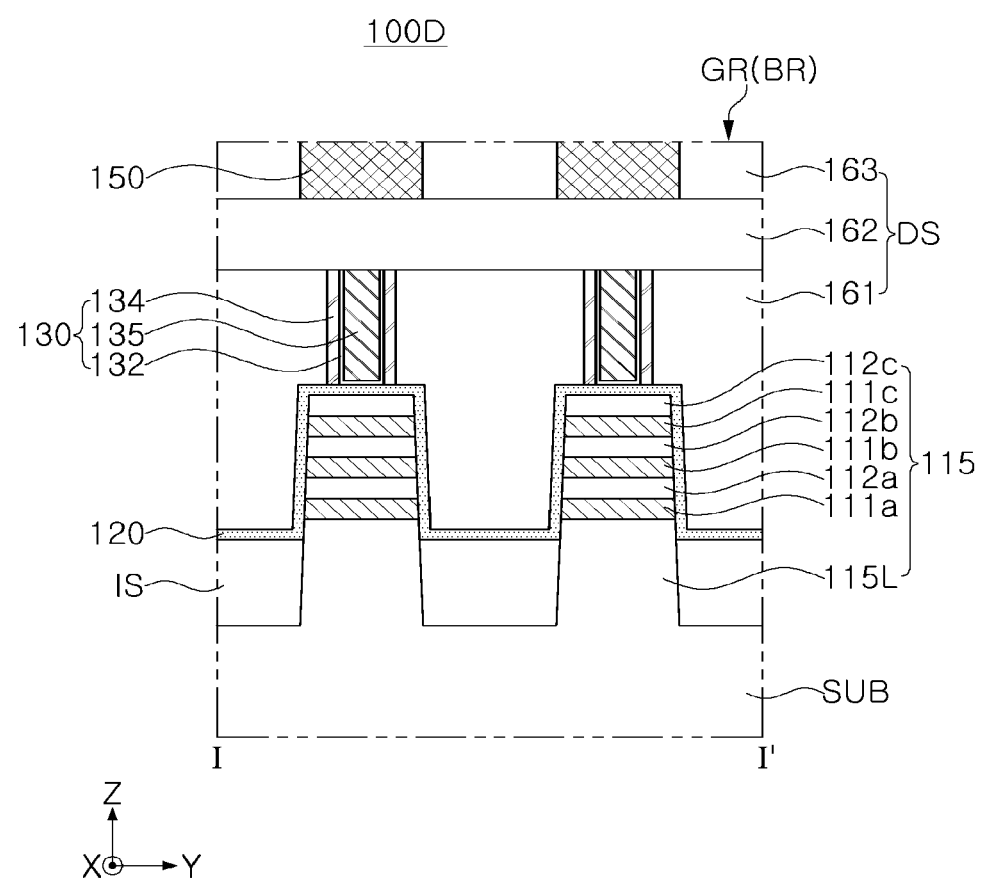

FIG. 3E is a cross-sectional view of a semiconductor device according to an example embodiment. FIG. 3E is a cross-sectional view of a semiconductor device viewed from a region different from FIG. 3C.

Referring to FIG. 3E, the semiconductor device 1 may further include a first dummy structure 100D. The first dummy structure 100D may have a structure similar to that of the first structure 100, or may not include the first contact structure 140. In an example embodiment, the first dummy structure 100D may include a first fin structure 115, a first dielectric layer 120, a first gate structure 130, and a first wiring layer 150. A second insulating layer 162 may be between the first gate structure 130 and the first wiring layer 150. The first gate structure 130 and the first wiring layer 150 may be spaced apart from each other (e.g., in the vertical direction Z) by a second insulating layer 162.

Figure 3F:
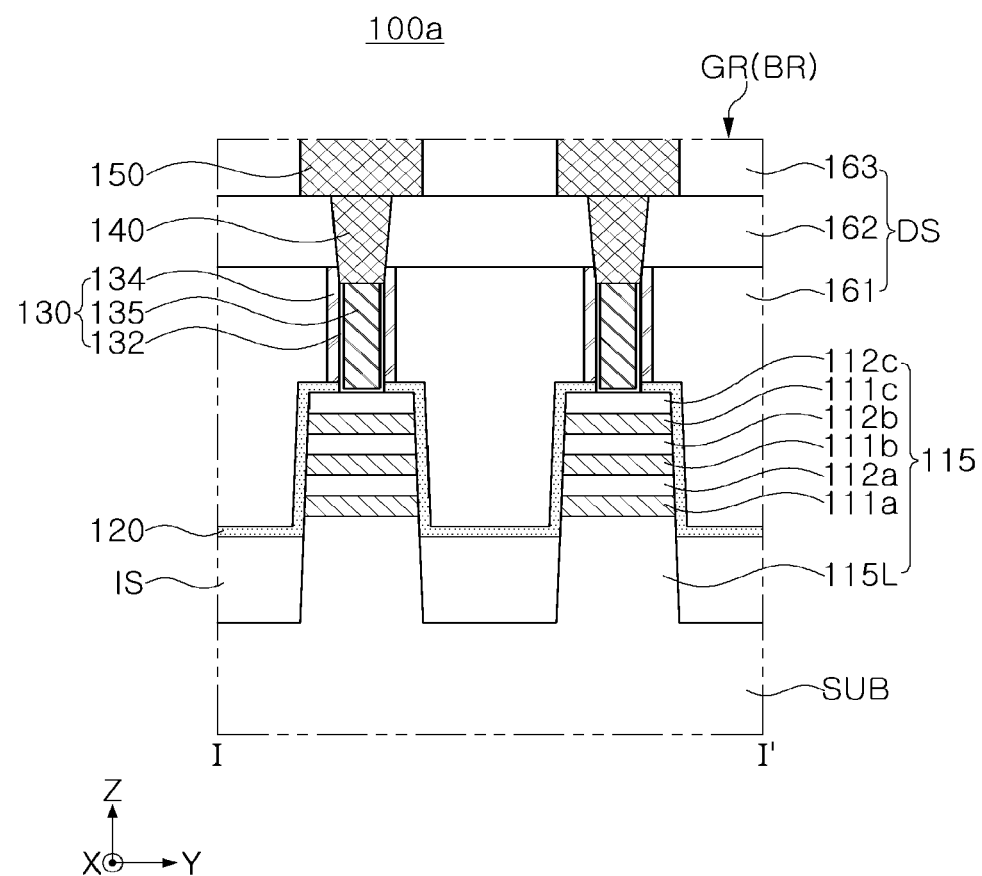

FIG. 3F is a cross-sectional view of a semiconductor device according to an example embodiment. FIG. 3F illustrates a region corresponding to FIG. 3C.

Referring to FIG. 3F, in the first structure 100a of the semiconductor device 1, the first gate dielectric layer 132 may cover a portion of the upper surface of the first fin structure 115. After a portion of the first dielectric layer 120 covering a portion of the upper surface of the first fin structure 115 is removed, the first gate dielectric layer 135 may be formed on the exposed upper surface of the first fin structure 115. A lower surface of the first gate dielectric layer 132 may be on or at a level lower than a level of the lower surface of the first gate spacer layer 134.

Figure 4A:
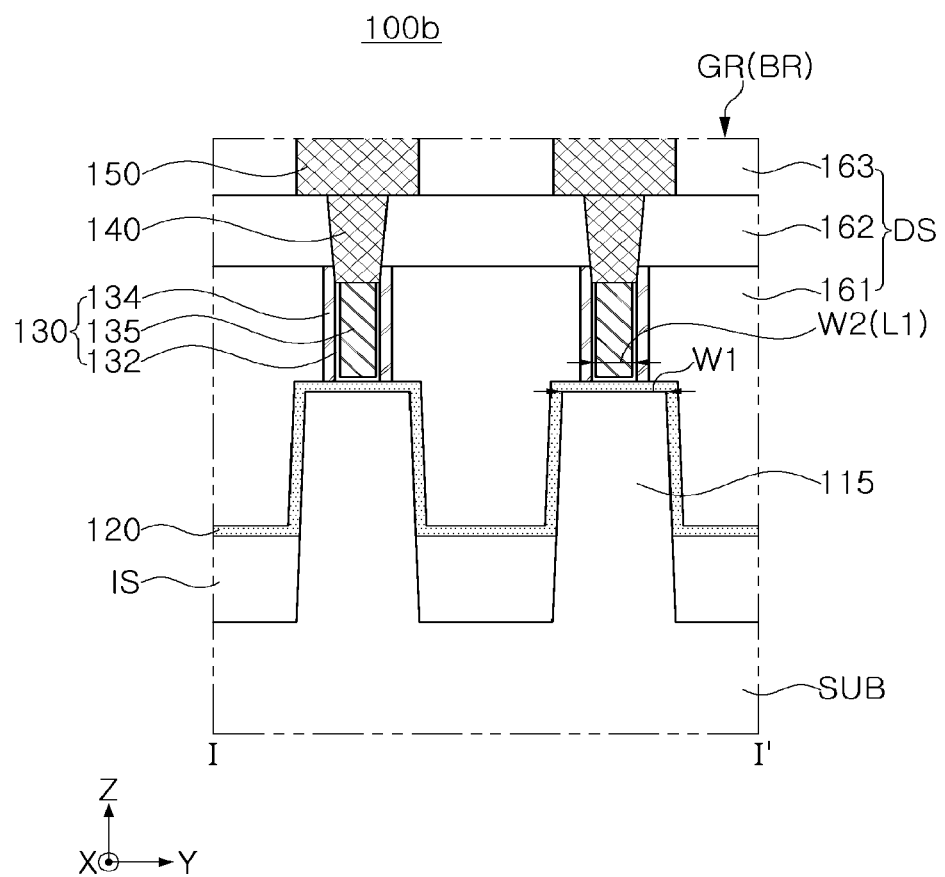
FIGS. 4A and 4B are cross-sectional views of a semiconductor device according to an example embodiment of the present disclosure.

FIG. 4A is a cross-sectional view of a semiconductor device according to an example embodiment. FIG. 4A illustrates a region corresponding to FIG. 3C.

Referring to FIG. 4A, in a first structure 100b of the semiconductor device 1, the first fin structure 115 may not include the stack structures 111a, 111b, 111c, 112a, 112b, and 112c, and may be configured as a single fin. The first fin structure 115 may extend in the vertical direction (Z) from the substrate SUB. The first fin structure 115 may be referred to as a first fin pattern.

In an example embodiment, a second width W2 of the first gate line portion of the first gate conductive layer 135 may be narrower than a first width W1 of an upper end of the first fin line portion of the first fin structure 115, as measured in the second direction (Y). The first width W1 of the first fin line portion of the first fin structure 115 may be a minimum width of the first fin structure 115 on a cross-sectional surface taken in the second direction (Y).

In an example embodiment, the second width W2 of the first gate line portion of the first gate conductive layer 135 in the second direction (Y) may be narrower than a width of a lower end of the first fin structure 115. The width of the lower end of the first fin structure 115 may be a maximum width of the first fin structure 115 in the second direction (Y).

Figure 4B:
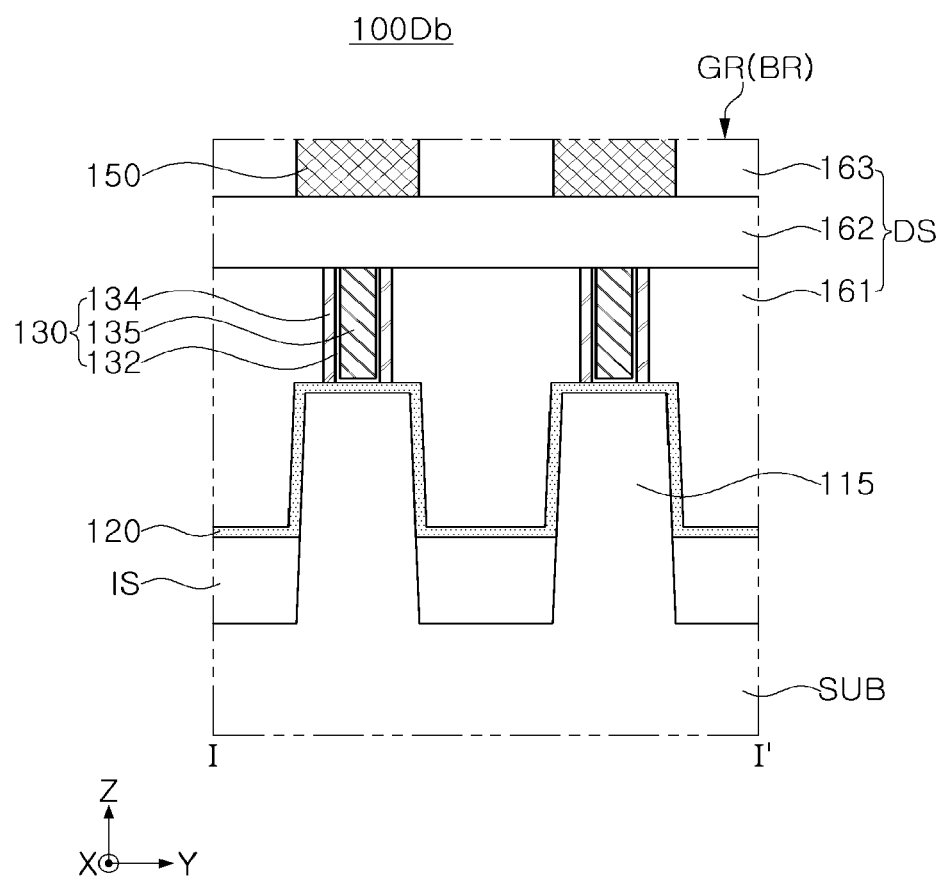

FIG. 4B is a cross-sectional view of a semiconductor device according to an example embodiment. FIG. 4B is a cross-sectional view of a semiconductor device viewed from a region different from FIG. 4A.

Referring to FIG. 4B, a semiconductor device 1 may further include a first dummy structure 100Db. The first dummy structure 100Db may have a structure similar to the first structure 100b, but may not include the first contact structure 140. As described in the aforementioned example embodiment with reference to FIG. 3C, the first gate structure 130 may be spaced apart from the first wiring layer 150 by the second insulating layer 162.

Figure 5A:
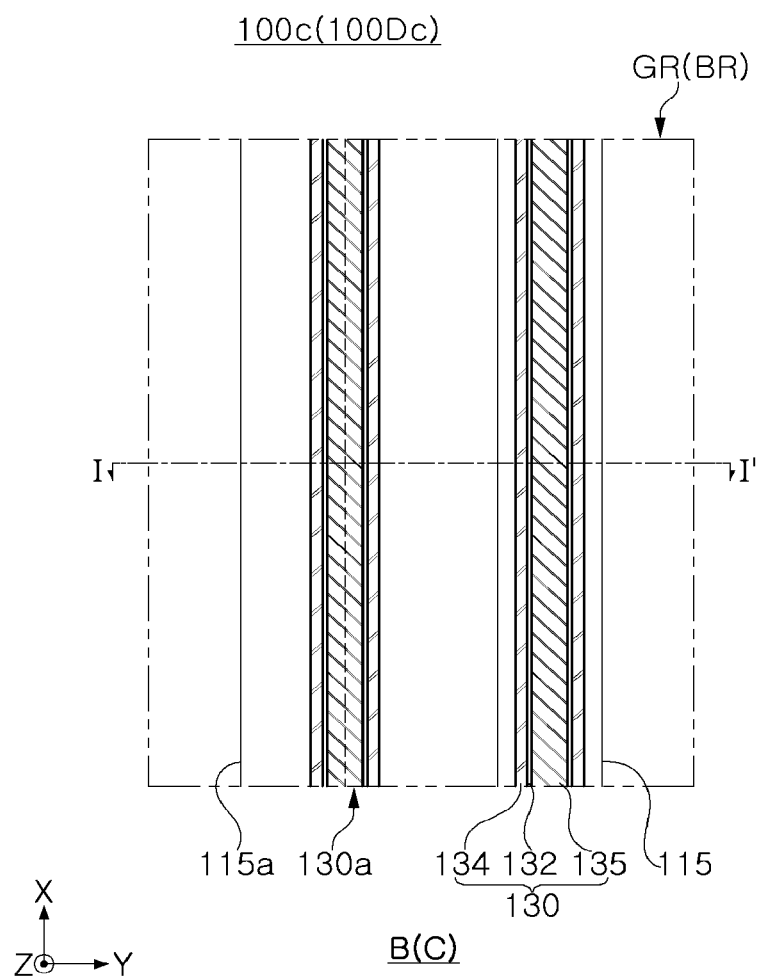
FIG. 5A is an enlarged plan view of a portion of a region of an example of a semiconductor device.

FIG. 5A is an enlarged plan view of a portion of a region of an example of a semiconductor device.

Figure 5B:
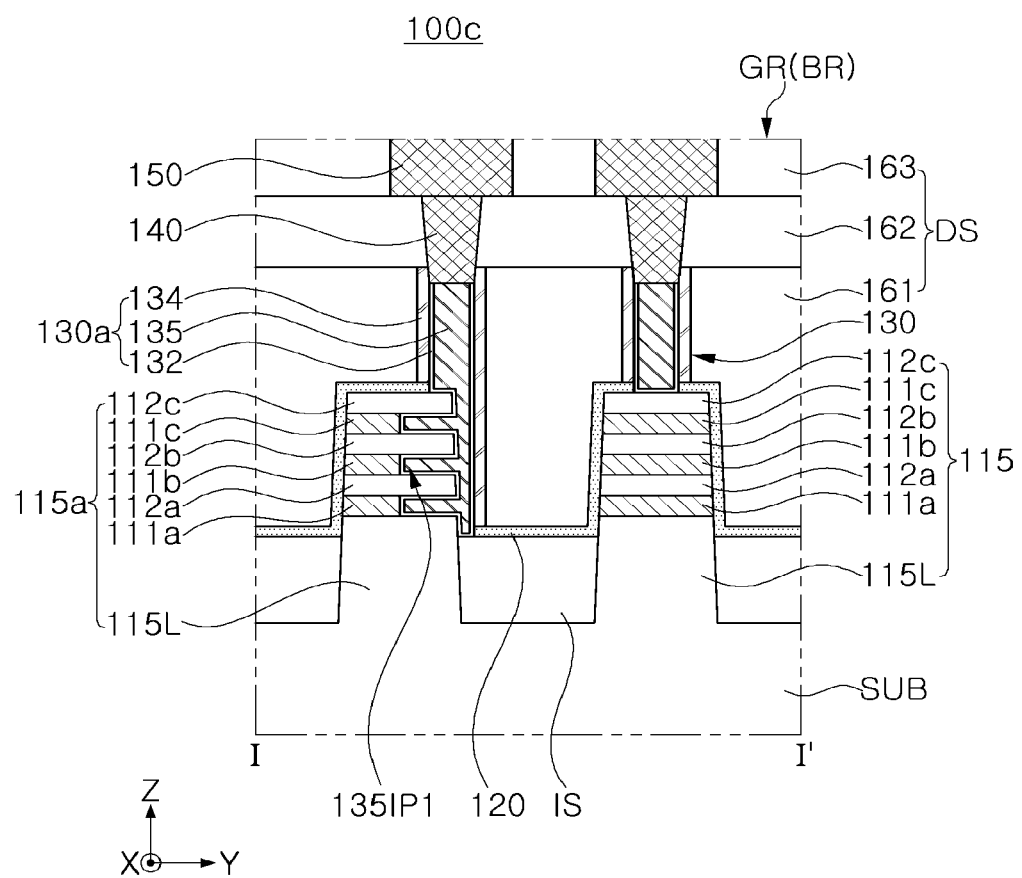
FIGS. 5B to 5D are cross-sectional views of a semiconductor device according to an example embodiment of the present disclosure.

FIG. 5B is a cross-sectional view of a semiconductor device according to an example embodiment. FIG. 5B is a cross-sectional view taken along line I-I' in FIG. 5A.

Referring to FIGS. 5A and 5B, in the first structure 100c of the semiconductor device 1, at least one first gate structure 130a of the first gate structures 130 may overlap a side surface of a first fin structure 115a in the vertical direction (Z).

In an example embodiment, the first gate structure 130a may have an asymmetric shape. In an example embodiment, a lower end of at least one of the first gate spacer layers 132 of the first gate structure 130a may be on or at a level lower than a level of the upper end of the first fin structure 115a. In an example embodiment, the first gate dielectric layer 132 and the first gate conductive layer 135 of the first gate structure 130a may be on side surfaces of a plurality of second layers 112a, 112b, and 112c of the first fin structure 115a.

In an example embodiment, in the first fin structure 115a, a portion of the first layers 111a, 111b, and 111c may be partially removed from the side surface exposed toward the first gate structure 130a, and another portion thereof may remain among the second layers 112a, 112b, and 112c. In this case, the plurality of remaining first layers 111a, 111b and 111c, the first gate dielectric layer 132, and the first gate conductive layer 135 may be formed together among the plurality of second layers 112a, 112b, and 112c.

In an example embodiment, the first gate conductive layer 135 of the first gate structure 130a may be on the first fin structure 115a, and at least a portion of the first gate conductive layer 135 may also be formed among the plurality of second layers 112a, 112b, and 112c of the first fin structure 115a. The plurality of second layers 112a, 112b, and 112c may be semiconductor layers. The first gate conductive layer 135 may include protrusions 1351P1 extending from the side surface of the first fin structure 115a to regions among the plurality of second layers 112a, 112b, and 112c.

Figure 5C:
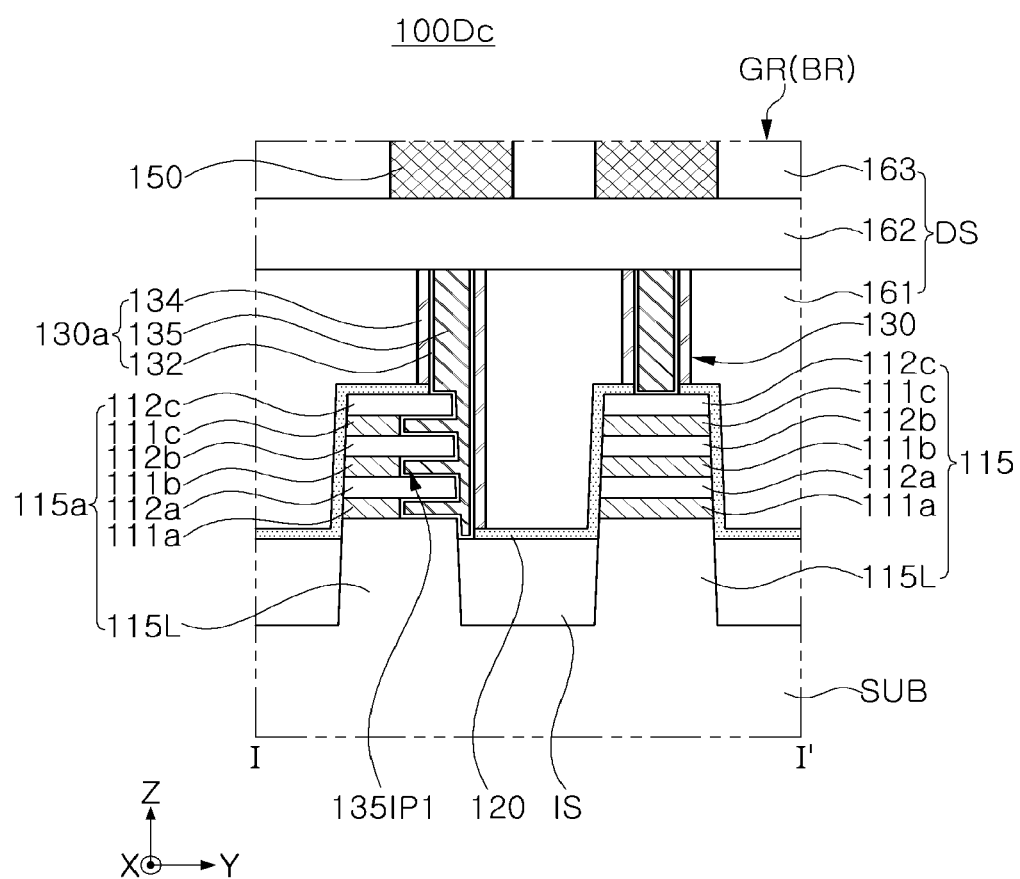

FIG. 5C is a cross-sectional view of a semiconductor device according to an example embodiment. FIG. 5C is a cross-sectional view of a semiconductor device viewed from a region different from FIG. 5B.

Referring to FIG. 5C, a semiconductor device 1 may further include a first dummy structure 100Dc. The first dummy structure 100Dc may have a structure similar to that of the first structure 100c, but may not include the first contact structure 140. As described in the aforementioned example embodiment with reference to FIG. 3C, the first gate structures 130 and 130*a* may be spaced apart from the first wiring layer 150 by the second insulating layer 162.

Figure 5D:
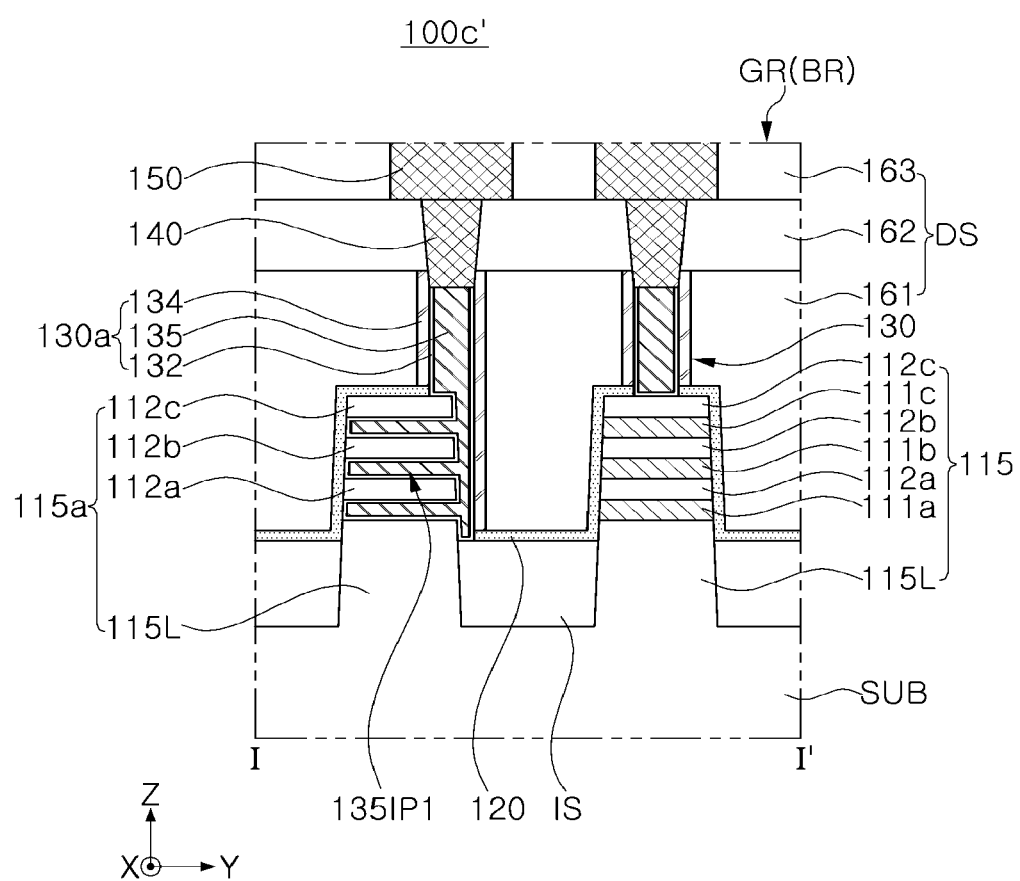

FIG. 5D is a cross-sectional view of a semiconductor device according to an example embodiment. FIG. 5D illustrates a region corresponding to FIG. 5B.

Referring to FIG. 5D, in the first structure 100*c'* of the semiconductor device 1, at least one first gate structure 130*a* of the first gate structures 130 may overlap a side surface of a first fin structure 115*a* in the vertical direction (Z).

In an example embodiment, the first fin structure 115*a* (on which the first gate structure 130*a* is disposed) may only include the plurality of second layers 112*a*, 112*b*, and 112*c* of the stack structures (111*a*, 111*b*, 111*c*, 112*a*, 112*b*, and 112*c*), e.g., may not include the first layers 111*a*, 111*b*, 111*c*), differently from the example embodiment illustrated in FIG. 3A. A first gate dielectric layer 132 and a first gate conductive layer 135 may be in a region from which the plurality of first layers 111*a*, 111*b*, and 111*c* have been removed. A portion of the first dielectric layer 120 covering the first fin structure 115*a* may be removed.

In an example embodiment, the first gate conductive layer 135 of the first gate structure 130*a* may be on the first fin structure 115*a*, and the first gate conductive layer 135 may also be formed among the plurality of second layers 112*a*, 112*b*, and 112*c* of the first fin structure 115*a*. The first gate conductive layer 135 may include protrusions 1351P1 extending from the side surface of the first fin structure 115*a* to regions among the plurality of second layers 112*a*, 112*b* and 112*c*. The protrusions 1351P1 may have side surfaces opposing the plurality of first layers 111*a*, 111*b*, and 111*c*.

Figure 6A:
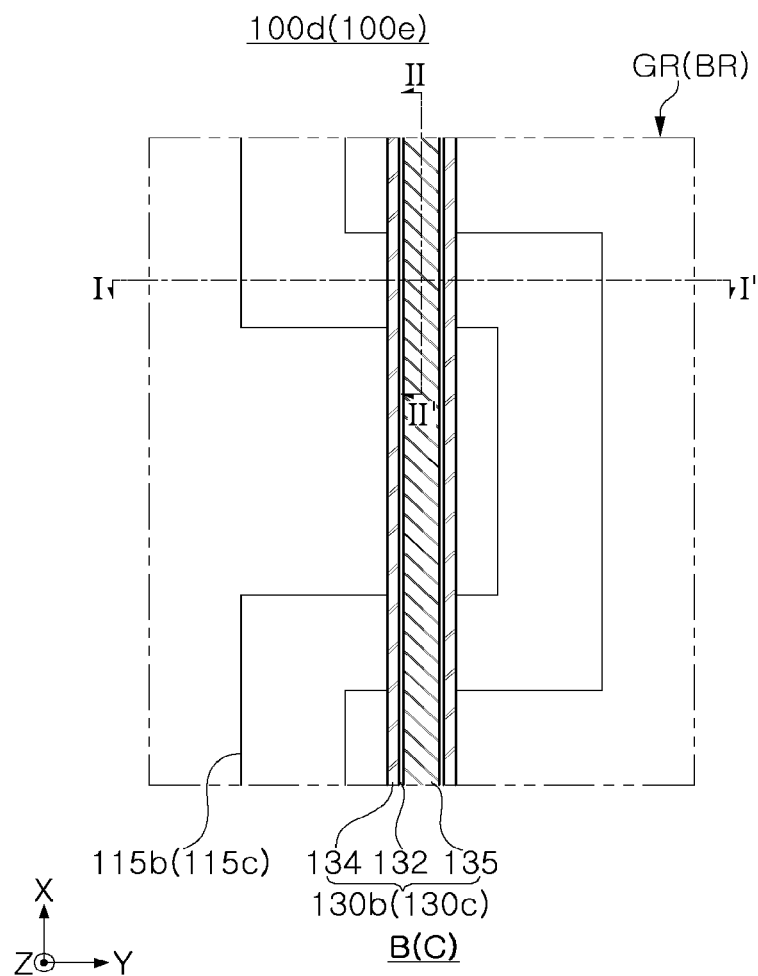
FIG. 6A is an enlarged plan view of a portion of a region of an example of a semiconductor device.

FIG. 6A is an enlarged plan view of a semiconductor device according to an example embodiment.

Figure 6B:
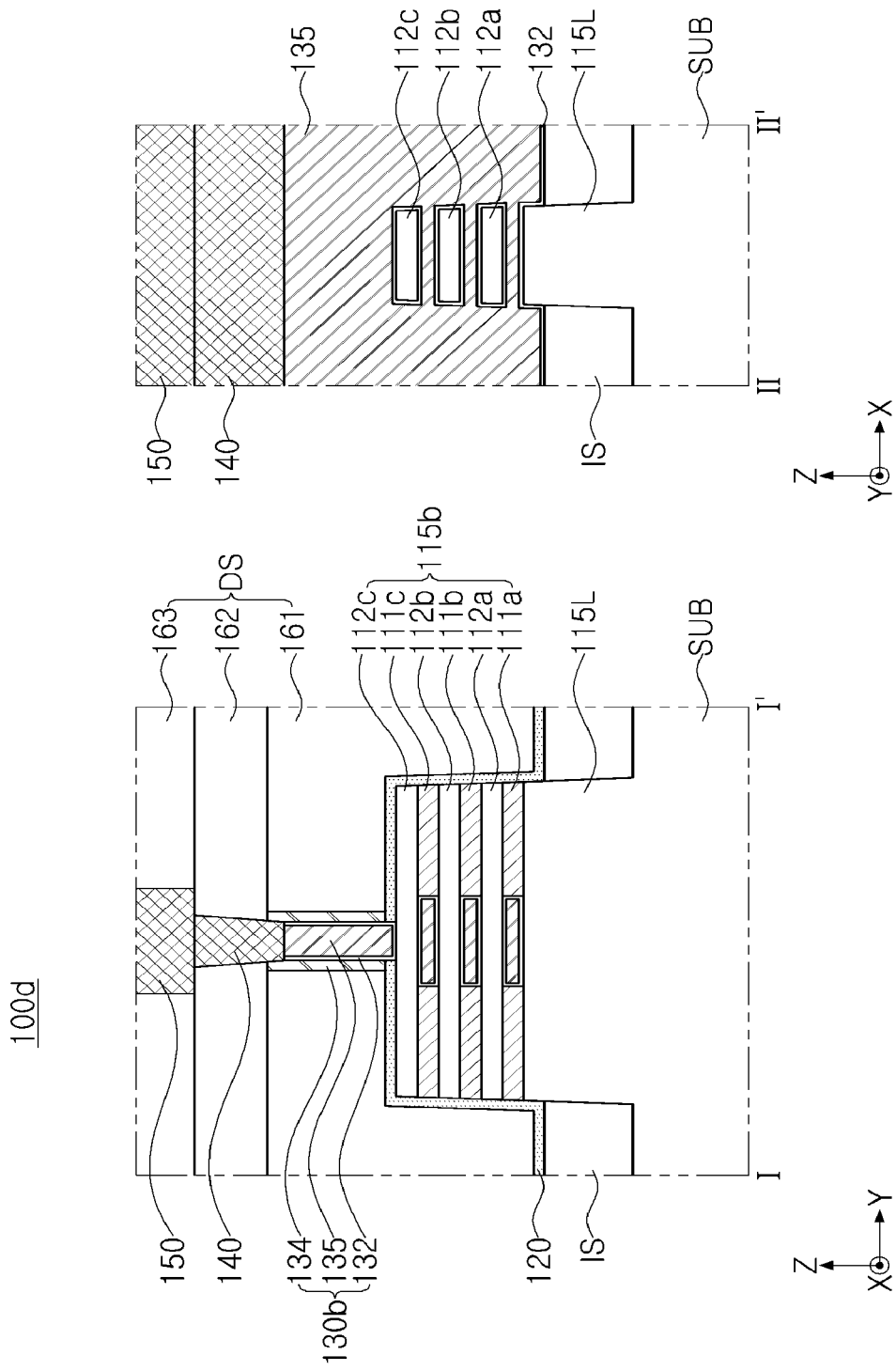
FIGS. 6B and 6C are cross-sectional views of a semiconductor device according to an example embodiment of the present disclosure.

FIG. 6B is a cross-sectional view of a semiconductor device according to an example embodiment. FIG. 6B is a cross-sectional view taken along lines I-I' and II-IF in FIG. 6A.

Referring to FIGS. 6A and 6B, in a first structure 100*d* of a semiconductor device 1, at least a region in which a first fin structure 115*b* and a first gate structure 130*b* may intersect with each other may be on a peripheral region PERI of a substrate SUB.

In the region where the first fin structure 115*b* and the first gate structure 130*b* intersect with each other, a portion of the first dielectric layer 120 may be removed, a plurality of first layers 111*a*, 111*b*, and 111*c* may be removed, and the first gate dielectric layer 132 and the first gate conductive layer 135 may be in the space from which the first layers 111*a*, 111*b*, and 111*c* have been removed.

In at least one cross-sectional surface of the first fin structure 115*b*, e.g., in a cross-sectional surface taken along line I-I' in FIG. 6B, a plurality of first layers 111*a*, 111*b*, and 111*c*, a first gate dielectric layer 132, and a first gate conductive layer 135 may be together among the plurality of second layers 112*a*, 112*b*, and 112*c*. In an example embodiment, a second silicon-germanium layer 111*b* may be on both sides of the first gate conductive layer 135 between the first silicon layer 112*a* and the second silicon layer 112*b*.

In at least one cross-sectional surface of the first fin structure 115*b*, e.g., in a cross-sectional surface taken along line II-IF in FIG. 6B, the first gate dielectric layer 132 and the first gate conductive layer 135 may also surround the plurality of second layers 112*a*, 112*b*, and 112*c*.

Figure 6C:
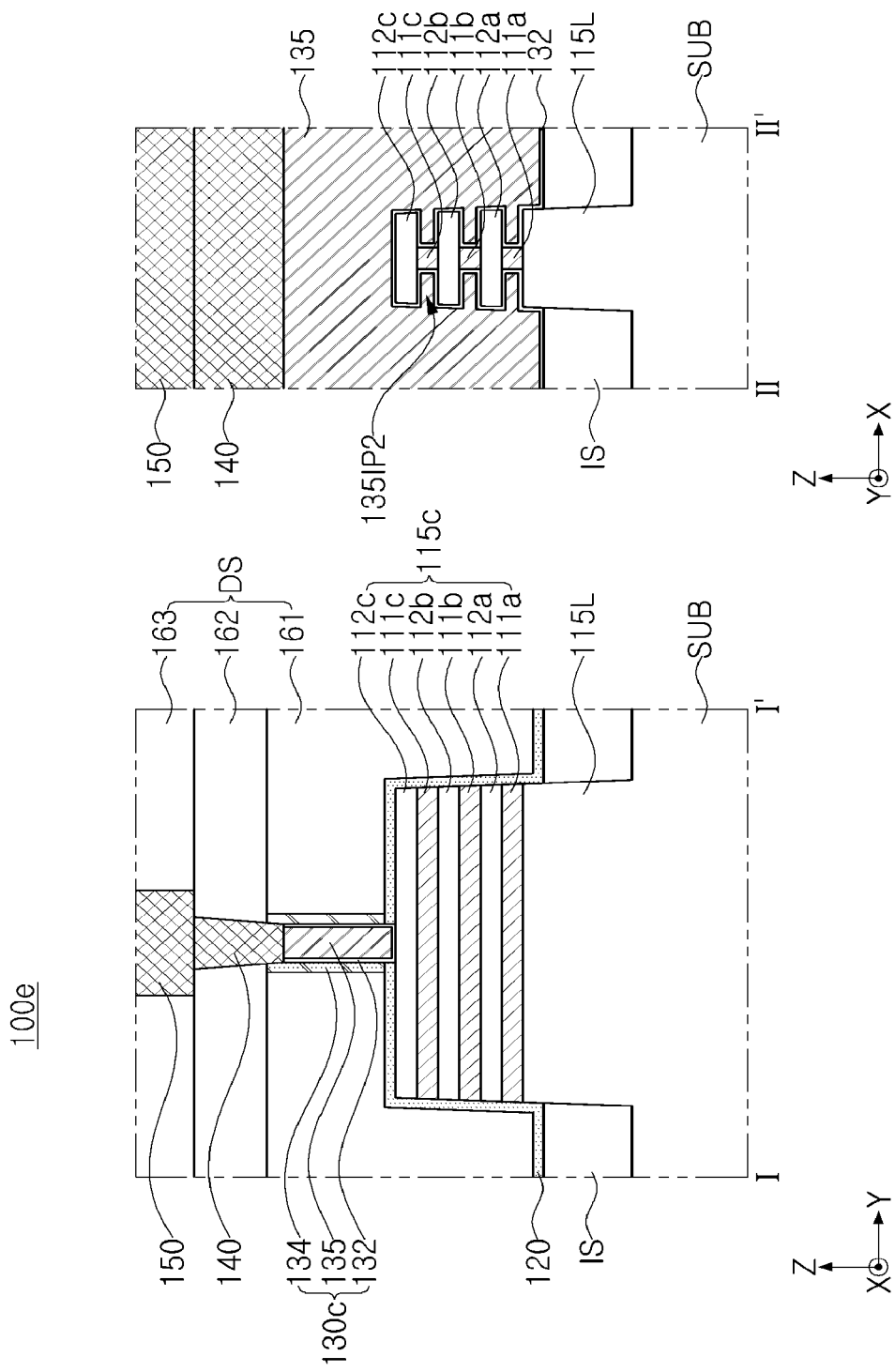

FIG. 6C is a cross-sectional view of a semiconductor device according to an example embodiment. FIG. 6C illustrates a region corresponding to FIG. 6B.

Referring to FIG. 6C, in a first structure 100*e* of the semiconductor device 1, differently from the first structure 100*d* in FIG. 6B, in the region in which the first fin structure 115*c* and a first gate structure 130*c* intersect with each other, the plurality of first layers 111*a*, 111*b*, and 111*c* may not be removed from the side surfaces along the first direction (X), and may partially remain.

In at least one cross-sectional surface of the first fin structure 115*c*, e.g., in a cross-sectional surface taken along line I-I' in FIG. 6C, the plurality of first layers 111*a*, 111*b*, and 111*c* may remain among the plurality of second layers 112*a*, 112*b*, and 112*c*.

In at least one cross-sectional surface of the first fin structure 115*c*, e.g., in a cross-sectional surface taken along line II-IF in FIG. 6C, the plurality of first layers 111*a*, 111*b*, and 111*c*, the first gate dielectric layer 132, and the first gate conductive layer 135 may be together among the plurality of second layers 112*a*, 112*b*, and 112*c*. In an example embodiment, protrusions 1351P2 of the first gate conductive layer 135 may be on both sides of the second silicon-germanium layer 111*b* between the first silicon layer 112*a* and the second silicon layer 112*b*.

Figure 7A:
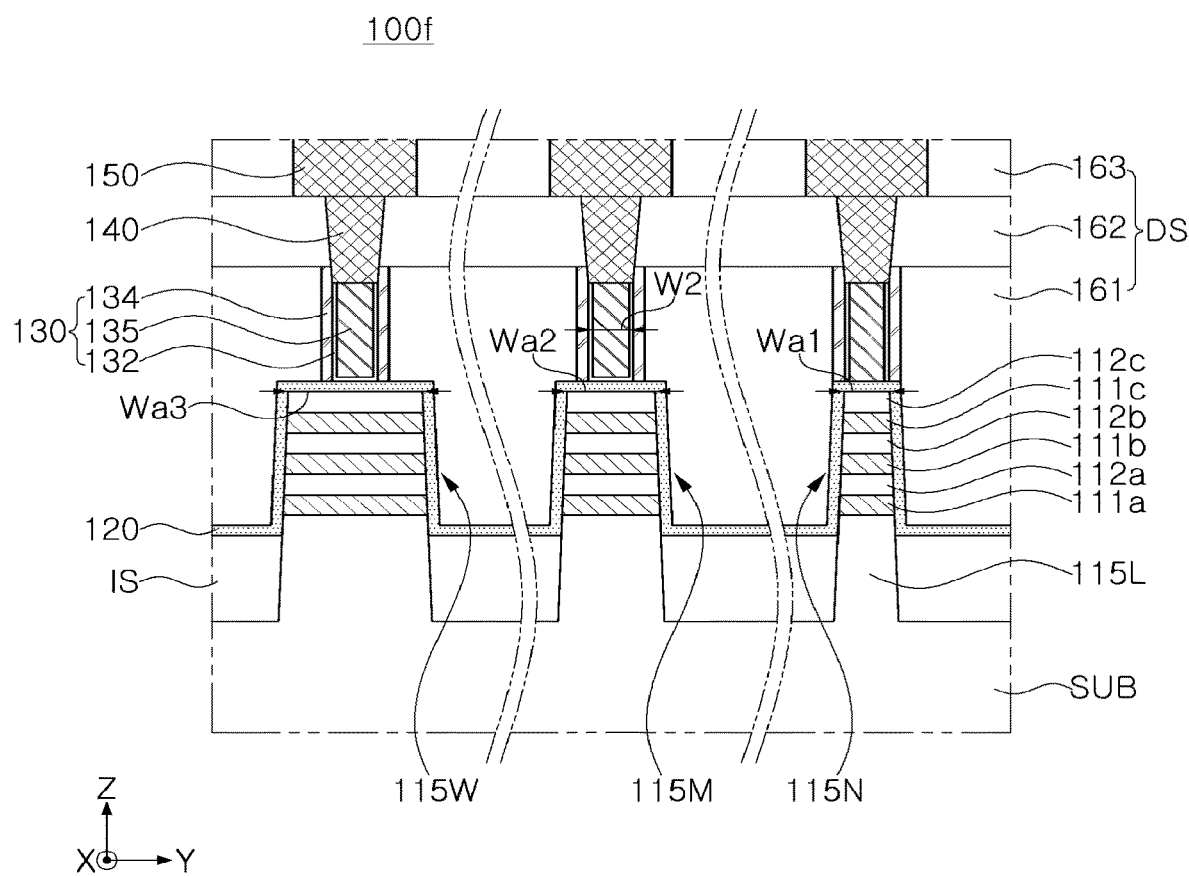
FIGS. 7A and 7B are cross-sectional views of a semiconductor device according to an example embodiment of the present disclosure.

FIG. 7A is a cross-sectional view of a semiconductor device according to an example embodiment.

Referring to FIG. 7A, in a first structure 100*f* of a semiconductor device 1, first fin structures 115N, 115M, and 115W may have different widths. The first fin structures 115N, 115M, and 115W may include a first narrow fin structure 115N having a first width Wa1, a first intermediate fin structure 115M having a second width Wa2 (greater than the first width Wa1), and a first wide fin structure 115W having a third width Wa3 (greater than the second width Wa2), as measured in the second direction (Y).

In the second direction (Y), the second width W2 of the first gate conductive layer 135 may be narrower than the first width Wa1 of the first narrow fin structure 115N, narrower than the second width Wa2 of the first intermediate fin structure 115M, and narrower than the third width Wa3 of the first wide fin structure 115W.

Each of the first narrow fin structure 115N, the first intermediate fin structure 115M, and the first wide fin structure 115W may include a plurality of first layers 111*a*, 111*b*, and 111*c* and a plurality of second layers 112*a*, 112*b*, and 112*c*.

Figure 7B:
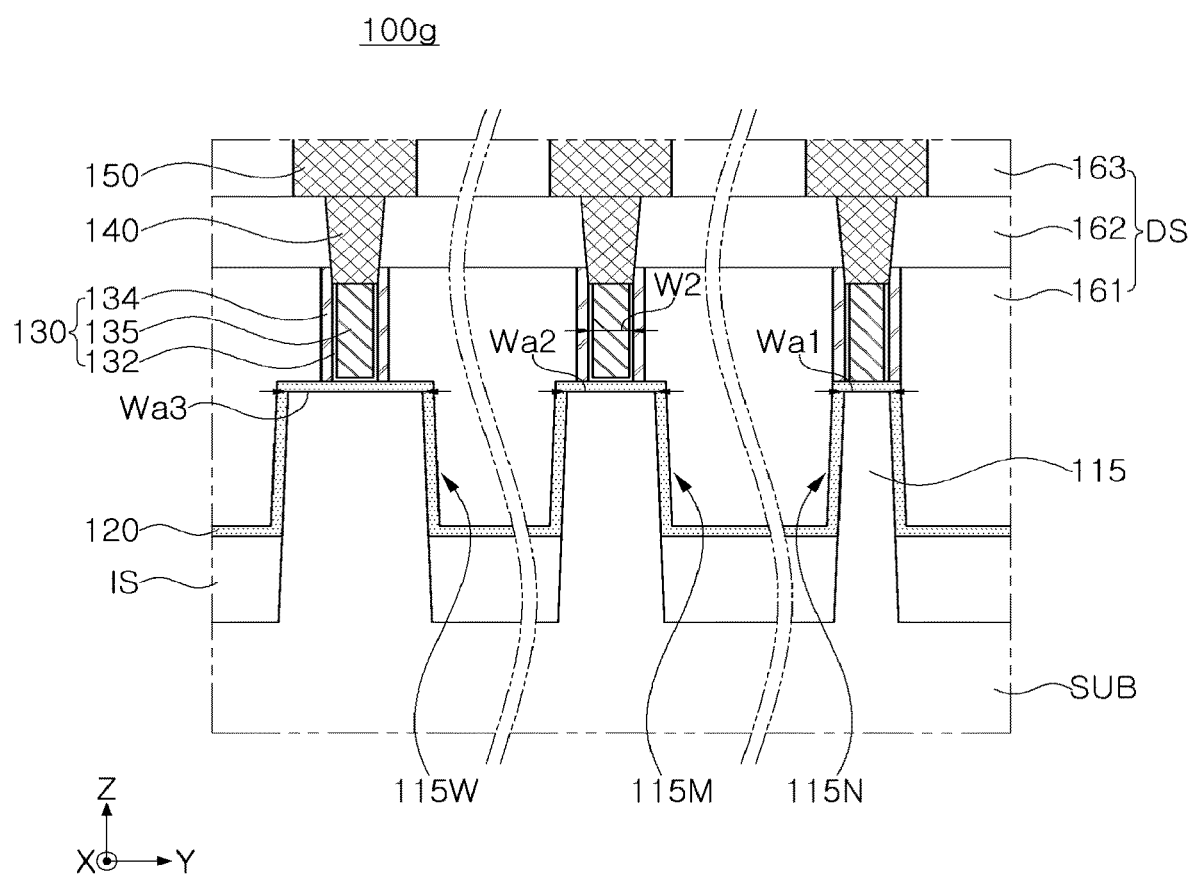

FIG. 7B is a cross-sectional view of a semiconductor device according to an example embodiment.

Referring to FIG. 7B, in a first structure 100*g* of a semiconductor device 1, each of the first fin structures 115N, 115M, and 115W may not include stack structures 111*a*, 111*b*, 111*c*, 112*a*, 112*b*, and 112*c*, and may be configured as a single fin. The first fin structures 115N, 115M, and 115W may extend from the substrate SUB in the vertical direction (Z). The first fin structures 115N, 115M, and 115W may be referred to as a first fin pattern.

In an example embodiment, in the second direction (Y), the second width W2 of the first gate conductive layer 135 may be narrower than the first width Wa1 of the first narrow fin structure 115N, narrower than the second width Wa2 of the first intermediate fin structure 115N, and narrower than the third width Wa3 of the first wide fin structure 115W.

Figure 8A:
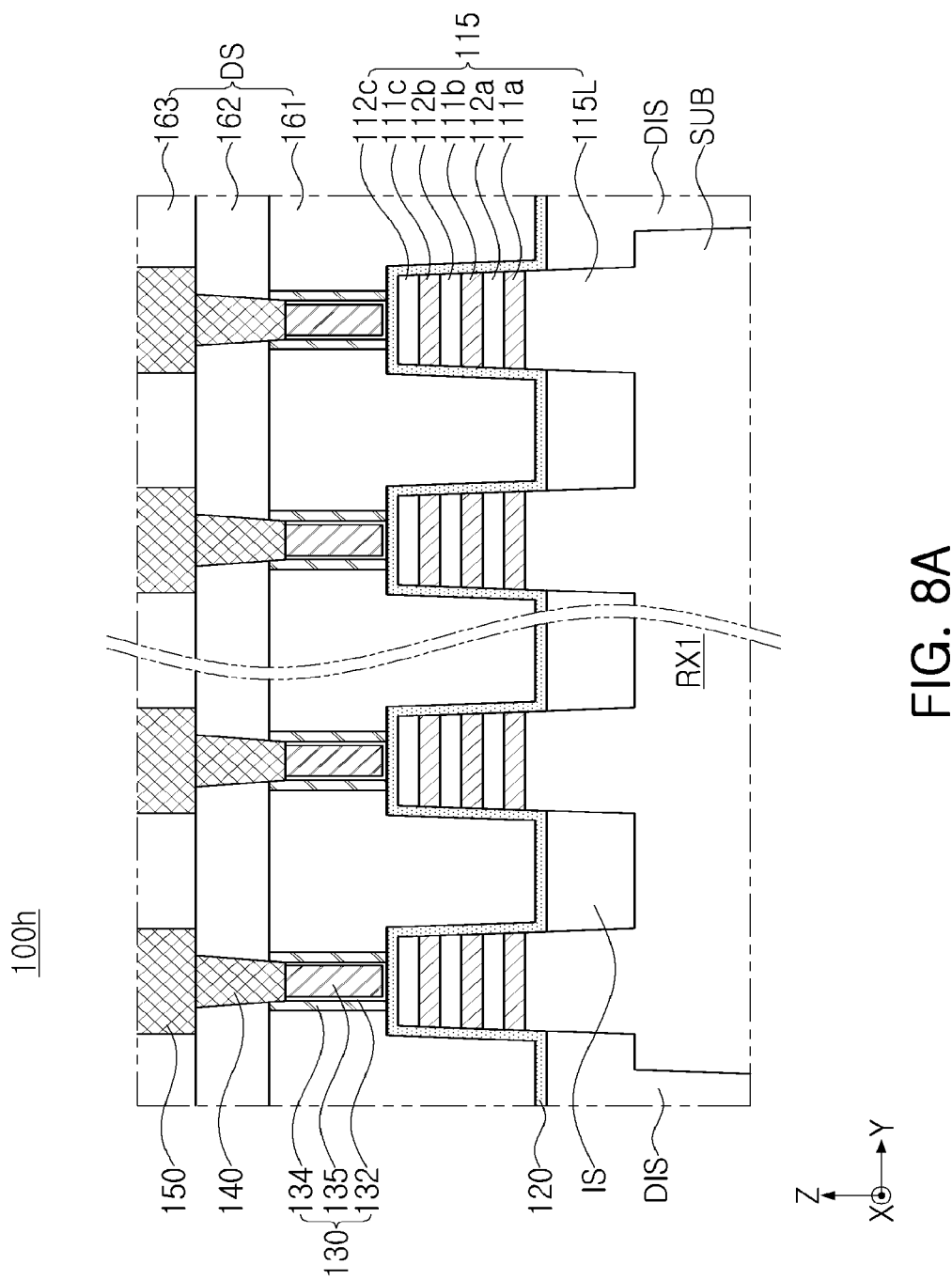
FIGS. 8A and 8B are cross-sectional views of a semiconductor device according to an example embodiment of the present disclosure.

FIG. 8A is a cross-sectional view of a semiconductor device according to an example embodiment.

Referring to FIG. 8A, the first fin structure 115 of the first structure 100*h* of the semiconductor device 1 may be on the first active region RX1. The first lower semiconductor region 115L of the first fin structure 115 may extend from the first active region RX1 in the vertical direction (Z). The first active region RX1 and the first lower semiconductor region 115L may be formed of the same material, e.g., silicon. The device isolation region IS may include a deep device isolation region DIS defining the first active region RX1. The deep device isolation region DIS may cover a side surface of the first active region RX1.

Figure 8B:
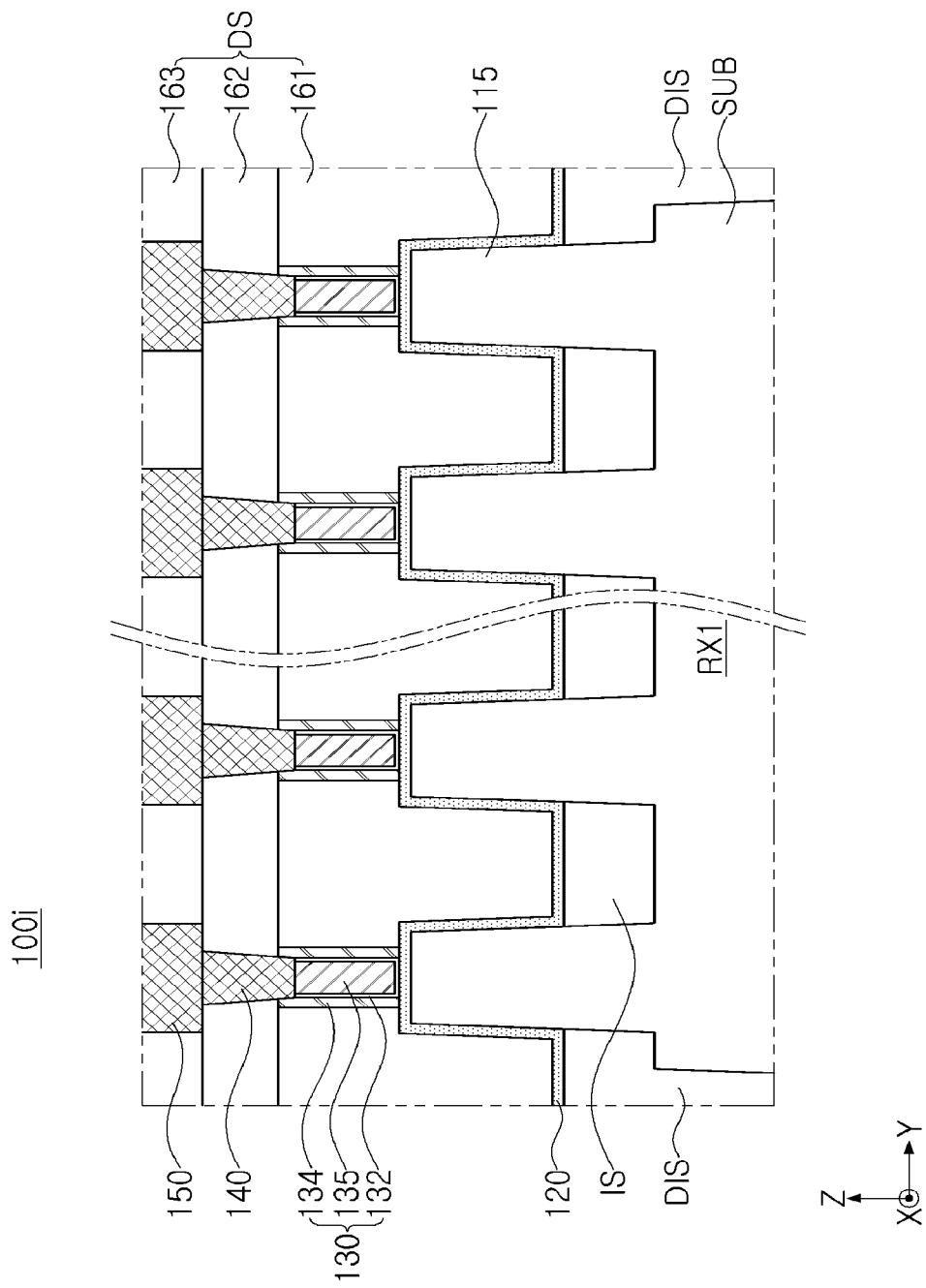

FIG. 8B is a cross-sectional view of a semiconductor device according to an example embodiment.

Referring to FIG. 8B, a first fin structures 115 formed on the first active region RX1 of the first structure 100*i* of the semiconductor device 1 may not include stack structures 111*a*, 111*b*, 111*c*, and 112*a*, 112*b*, and 112*c*, and may form a single pin.

Figure 9A:
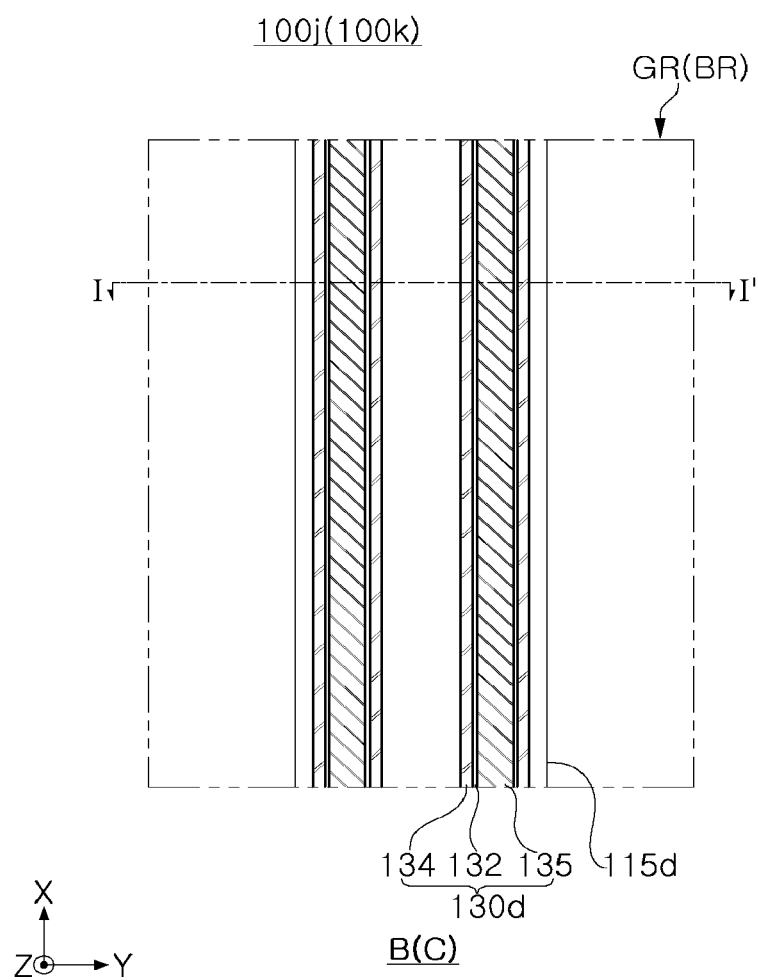
FIG. 9A is an enlarged plan view of a portion of a region of an example of a semiconductor device.

FIG. 9A is a plan view of a semiconductor device according to an example embodiment.

Figure 9B:
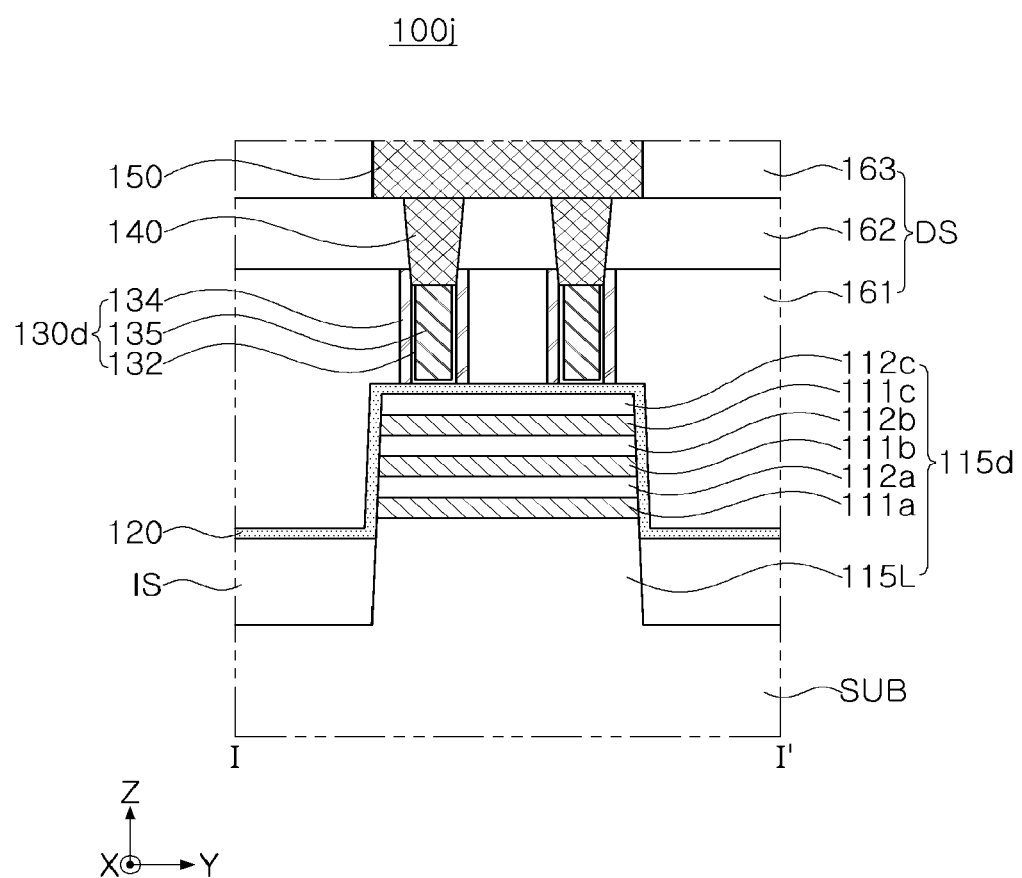
FIGS. 9B and 9C are cross-sectional views of a semiconductor device according to an example embodiment of the present disclosure.

FIG. 9B is a cross-sectional view of a semiconductor device according to an example embodiment, taken along line I-I' in FIG. 9A.

Referring to FIGS. 9A and 9B, in a first structure 100*j* of a semiconductor device 1, structures of the first fin structure 115*d* and the first gate structure 130*d* may be different from the aforementioned example embodiment. The first fin structure 115 may have a width that is relatively wider than the width of the first fin structures described in the aforementioned example embodiments described with reference to FIGS. 3A to 8B. The first gate structure 130*d* may be disposed in at least two rows on the upper surface of the first fin structure 115. The first gate conductive layer 135 may be disposed in at least two rows on the upper surface of the first fin structure 115. The second width W2 of the first gate conductive layer 135 may be narrower than the width of the first fin structure 115.

Figure 9C:
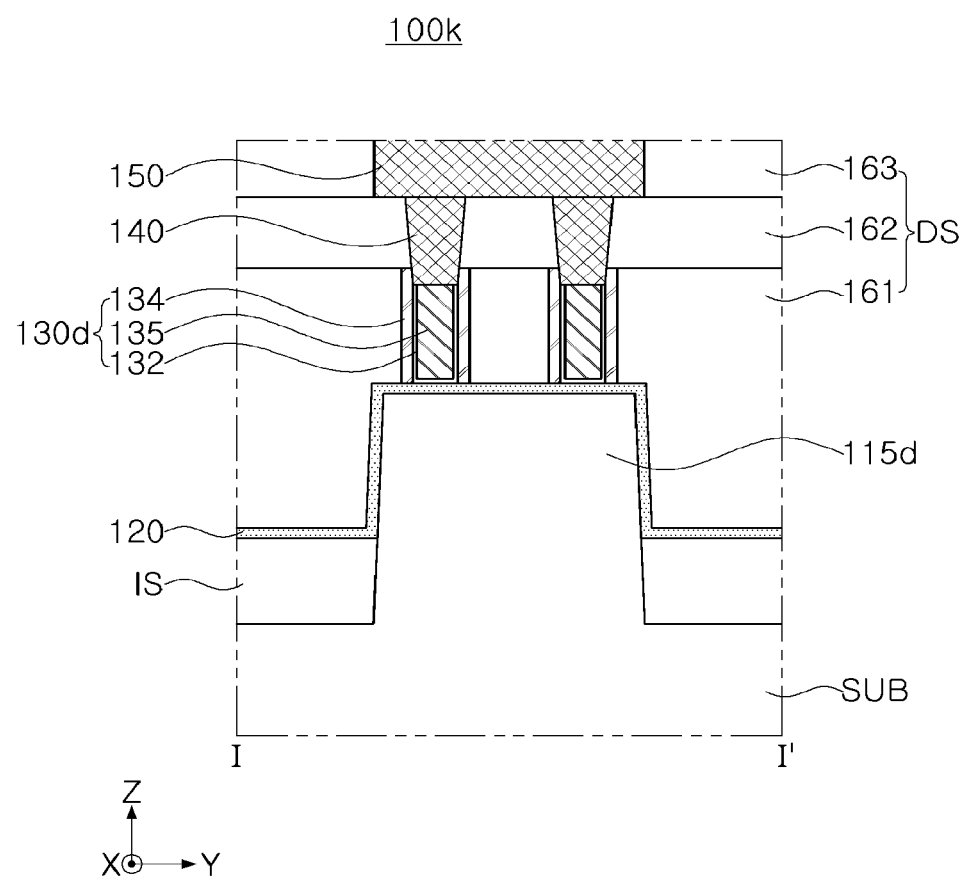

FIG. 9C is a cross-sectional view of a semiconductor device according to an example embodiment, illustrating a region corresponding to FIG. 9B.

Referring to FIG. 9C, in a first structure 100*k* of the semiconductor device 1, the first fin structure 115 may not include the stack structures 111*a*, 111*b*, 111*c*, 112*a*, 112*b*, and 112*c*, and may be configured as a single fin.

Figure 10A:
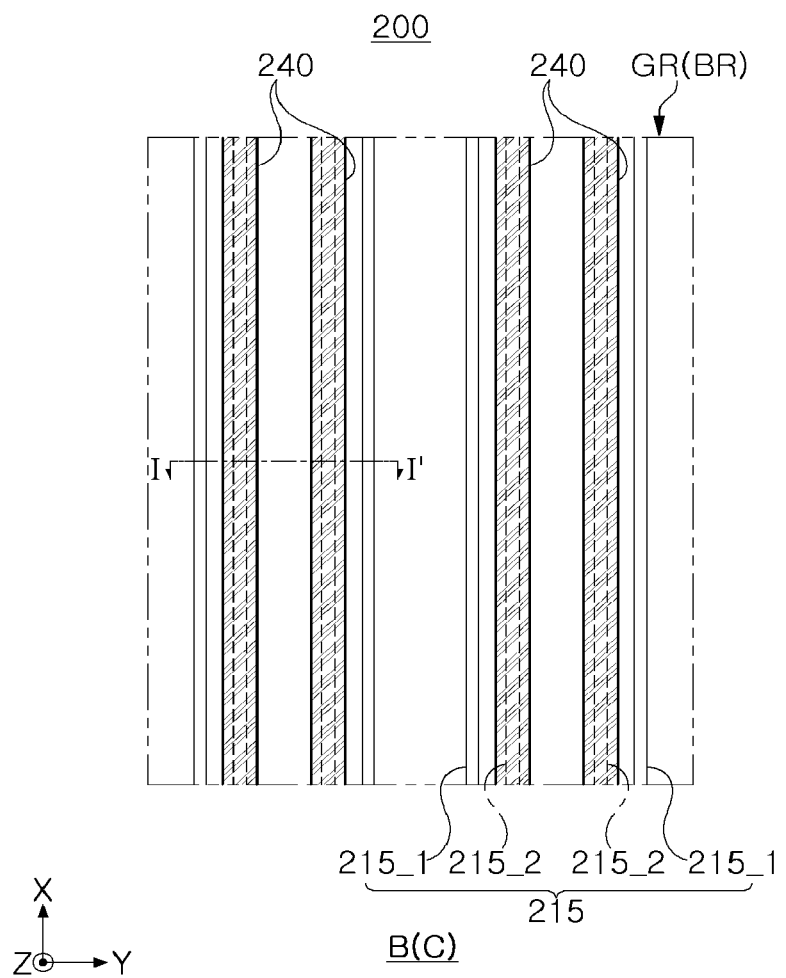
FIG. 10A is an enlarged plan view of a portion of a region of an example of a semiconductor device.

FIG. 10A is an enlarged plan view of a portion of a region of an example of a semiconductor device.

Figure 10B:
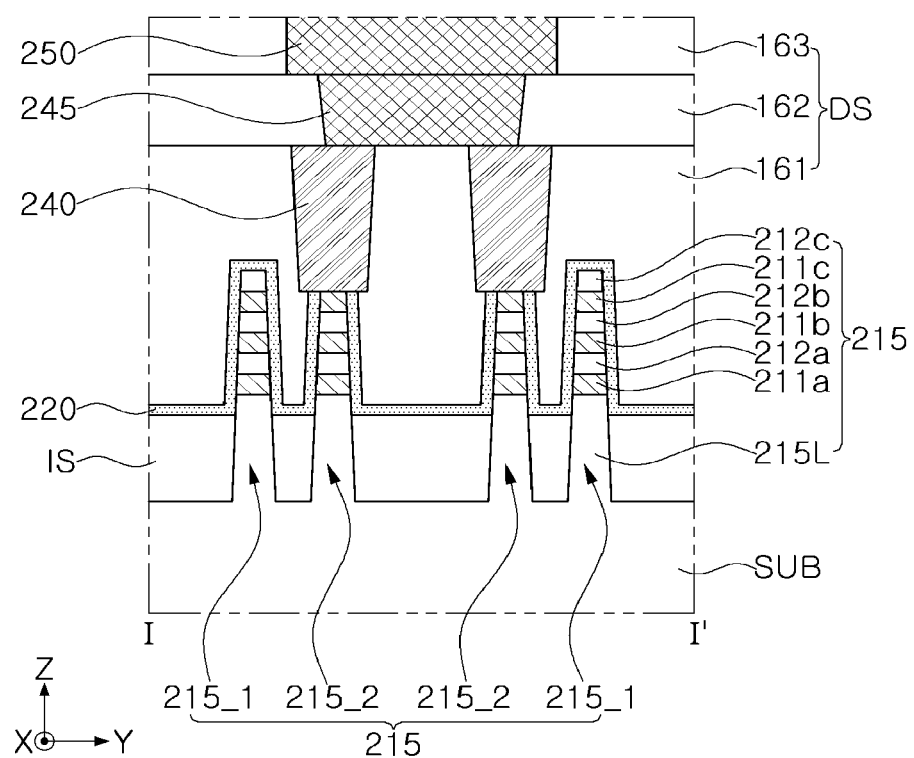
FIGS. 10B and 10C are cross-sectional views of a semiconductor device according to an example embodiment of the present disclosure.

FIG. 10B is a cross-sectional view of a semiconductor device according to an example embodiment, taken along line I-I' in FIG. 10A.

Referring to FIGS. 1, 3A, 3B, 10A, and 10B together, a semiconductor device 1 may include first structures 100 and second structures 200.

The second structures 200 may be on a peripheral region PERI of a substrate SUB. The second structures 200 may be on a guard-ring region GR or a blocking region BR of the peripheral region PERI of the substrate SUB. The second structures 200 may also protect the integrated circuit structure 10 on the central region IC along with the first structures 100. The second structures 200 may include a moisture oxidation barrier structure or a crack stop structure surrounding the integrated circuit structure 10 on the central region IC. The second structures 200 may help reduce or prevent propagation of cracks, and may help prevent moisture or air from permeating from the outside. The second structures 200 may help block electrostatic current which could otherwise flow in from the outside.

Each of the second structures 200 may include a device isolation region IS, a second fin structure 215, a second dielectric layer 220, an insulating structure DS, a second contact structure 240, a connection structure 245, and a second wiring layer 250. Differently from the first structure 100, the second structure 200 may not include a gate structure.

The second fin structure 215 may have a structure the same as or similar to the first fin structure 115. The second fin structure 215 may be defined by the device isolation region IS. The second fin structure 215 may extend in the first direction (X). The second fin structure 215 may have a shape protruding further upwardly than an upper surface of the device isolation region IS.

The second fin structure 215 may include a second lower semiconductor region 215L and stack structures 211*a*, 211*b*, 211*c*, 212*a*, 212*b*, and 212*c* on the second lower semiconductor region 215L. The stack structures 211*a*, 211*b*, 211*c*, 212*a*, 212*b*, and 212*c* may include a plurality of third layers 211*a*, 211*b*, and 211*c* and a plurality of fourth layers 212*a*, 212*b*, and 212*c*, alternately stacked.

The plurality of third layers 211*a*, 211*b*, and 211*c* may include a fourth silicon-germanium layer 211*a*, a fifth silicon-germanium layer 211*b*, and a sixth silicon-germanium layer 211*c*, spaced apart from one another in a vertical direction (Z).

The plurality of fourth layers 212*a*, 212*b*, and 212*c* may include a fourth silicon layer 212*a*, a fifth silicon layer 212*b*, and a sixth silicon layer 212*c*, spaced apart from one another in the vertical direction (Z).

The respective descriptions in the aforementioned example embodiment described with reference to FIG. 3B will be applied to the descriptions of the plurality of third layers 211*a*, 211*b*, and 211*c* and the plurality of fourth layers 212*a*, 212*b*, and 212*c* which correspond to the descriptions of the plurality of first layers 111*a*, 111*b*, and 111*c* and second layers 112*a*, 112*b*, and 112*c* illustrated in FIG. 3A.

The second fin structure 215 may include a pair of first outer fin patterns 215_1 and a pair of first inner fin patterns 215_2. The pair of first inner fin patterns 215_2 may be between the pair of first outer fin patterns 215_1. The pair of first outer fin patterns 215_1 and the pair of first inner fin patterns 215_2 may extend side by side (e.g., in parallel) with each other in at least one direction.

The second dielectric layer 220 may cover the device isolation region IS and the second fin structure 215. The second dielectric layer 220 may have a structure the same as or similar to a structure of the first dielectric layer 120. The second dielectric layer 220 may be formed of the same material as that of the first dielectric layer 120. The second dielectric layer 220 may be formed in the same process for forming the first dielectric layer 120. The second dielectric layer 220 and the first dielectric layer 120 may be connected to each other.

The insulating structure DS may be on the second structure 200. The first insulating layer 161 of the insulating structure DS may cover the second dielectric layer 220. The second insulating layer 162 may be on the first insulating layer 161, and the third insulating layer 163 may be on the second insulating layer 162. In the second structure 200, the insulating structure DS may be referred to as a second insulating structure.

The second contact structure 240 may extend in the same direction as the direction in which the second fin structure 215 may extend. The second contact structure 240 may penetrate through the first insulating layer 161. The second contact structure 240 may include the above-described metal nitride, the metal material, or the metal-semiconductor compound. The second contact structure 240 may be formed in the same process for forming the first circuit contact structure CP1 of the integrated circuit structure 10 and may have a structure the same as or similar to a structure of the first circuit contact structure CP1. The second contact structure 240 may be referred to as a lower contact structure.

In an example embodiment, the second contact structure 240 may be connected to at least a portion of the second fin structures 215. At least two of the second contact structures 240 may be side by side with each other on one second fin structure 215. Each of the at least two second contact structures 240 may be recessed into upper portions of the first inner fin patterns 215_2 on the first inner fin patterns 215_2, respectively.

In an example embodiment, the second contact structure 240 may not be in contact with the first outer fin patterns 215_1.

In an example embodiment, a width of the second contact structure 240 may be greater than a width of the second fin structure 215. In an example embodiment, a width of a lower end of the second contact structure 240 may be greater than a width of an upper end of the second fin structure 215 (e.g., a width of the upper end of the first inner patterns 215_2 facing or in contact with the second contact structure 240).

In an example embodiment, the second contact structure 240 may be directly in contact with the second dielectric layer 220.

A connection structure 245 may be on the second contact structure 240. The connection structure 245 may penetrate through the second insulating layer 162. The connection structure 245 may be connected to the second wiring layer 250. The connection structure 245 may include the metal nitride or the metal material described in the aforementioned example embodiment. The connection structure 245 may be referred to as an upper contact structure.

The second wiring layer 250 may be in the third insulating layer 163. The second wiring layer 250 may be connected to the connection structure 245 and may be electrically connected to the second contact structure 240. The second wiring layer 250 may have a structure the same as or similar to a structure of the first wiring layer 150. The second wiring layer 250 may be formed in the same process for forming the first wiring layer 150.

Figure 10C:
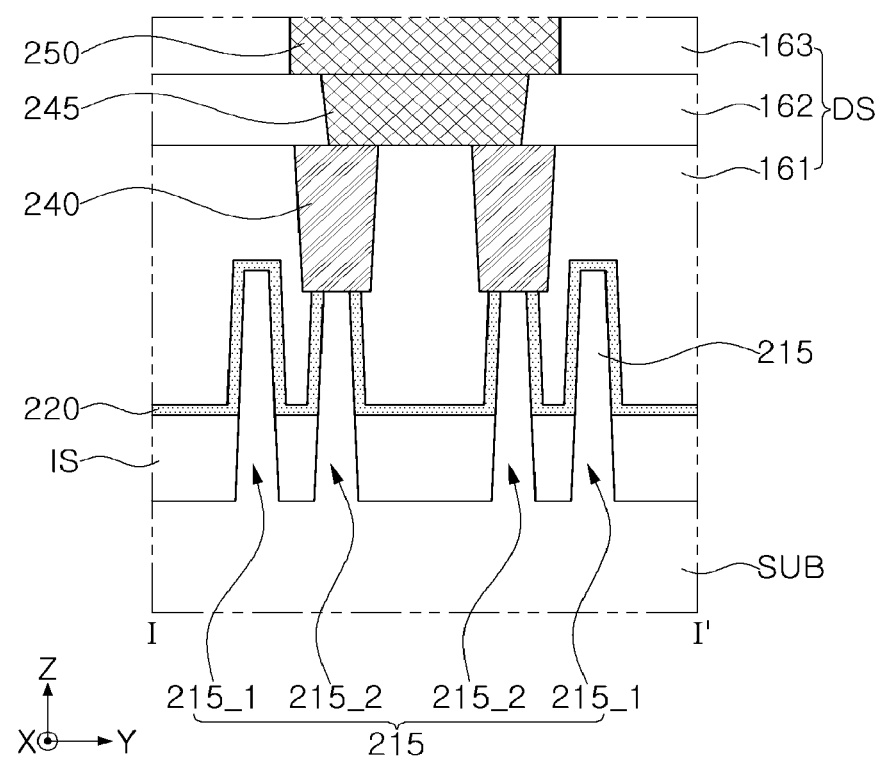

FIG. 10C is a cross-sectional view of a semiconductor device according to an example embodiment.

Referring to FIG. 10C, in a second structure 200a of a semiconductor device 1, a second fin structure 215 may not include stack structures 211a, 211b, 211c, 212a, 212b, and 212c, and may be configured as a single fin.

Figure 11:
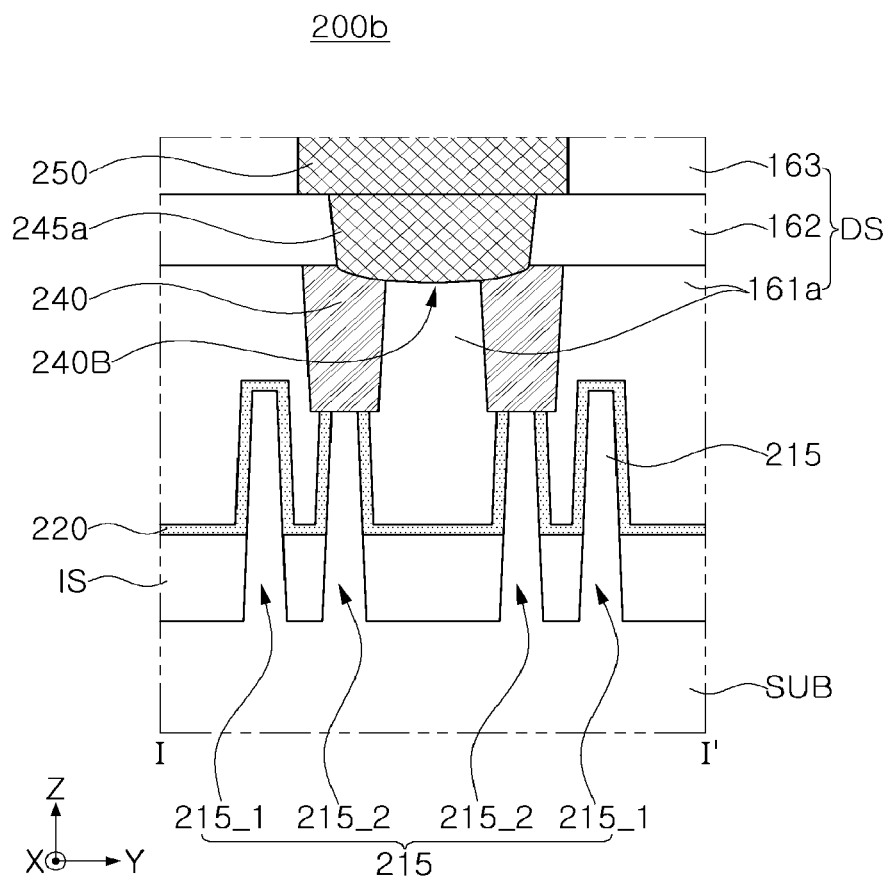
FIG. 11 is a cross-sectional view of a semiconductor device according to an example embodiment of the present disclosure.

FIG. 11 is a cross-sectional view of a semiconductor device according to an example embodiment.

Referring to FIG. 11, in a second structure 200b of a semiconductor device 1, an upper portion of the second contact structure 240 may be recessed. The connection structure 245 may have a bottom surface 245B curved downwardly (e.g., convexly protruding toward the substrate). The bottom surface 245B of the connection structure 245 may be on or at a level lower than (e.g., closer to the substrate SUB in the vertical Z direction than) an upper surface of the second contact structure 240. An upper portion of the first insulating layer 161a may also be recessed between the adjacent second contact structures 240 and below the connection structure 245. Accordingly, the first insulating layer 161a between the adjacent second contact structures 240 and below the connection structure 245a may have a groove curved towards an upper surface of the substrate SUB.

Figure 12A:
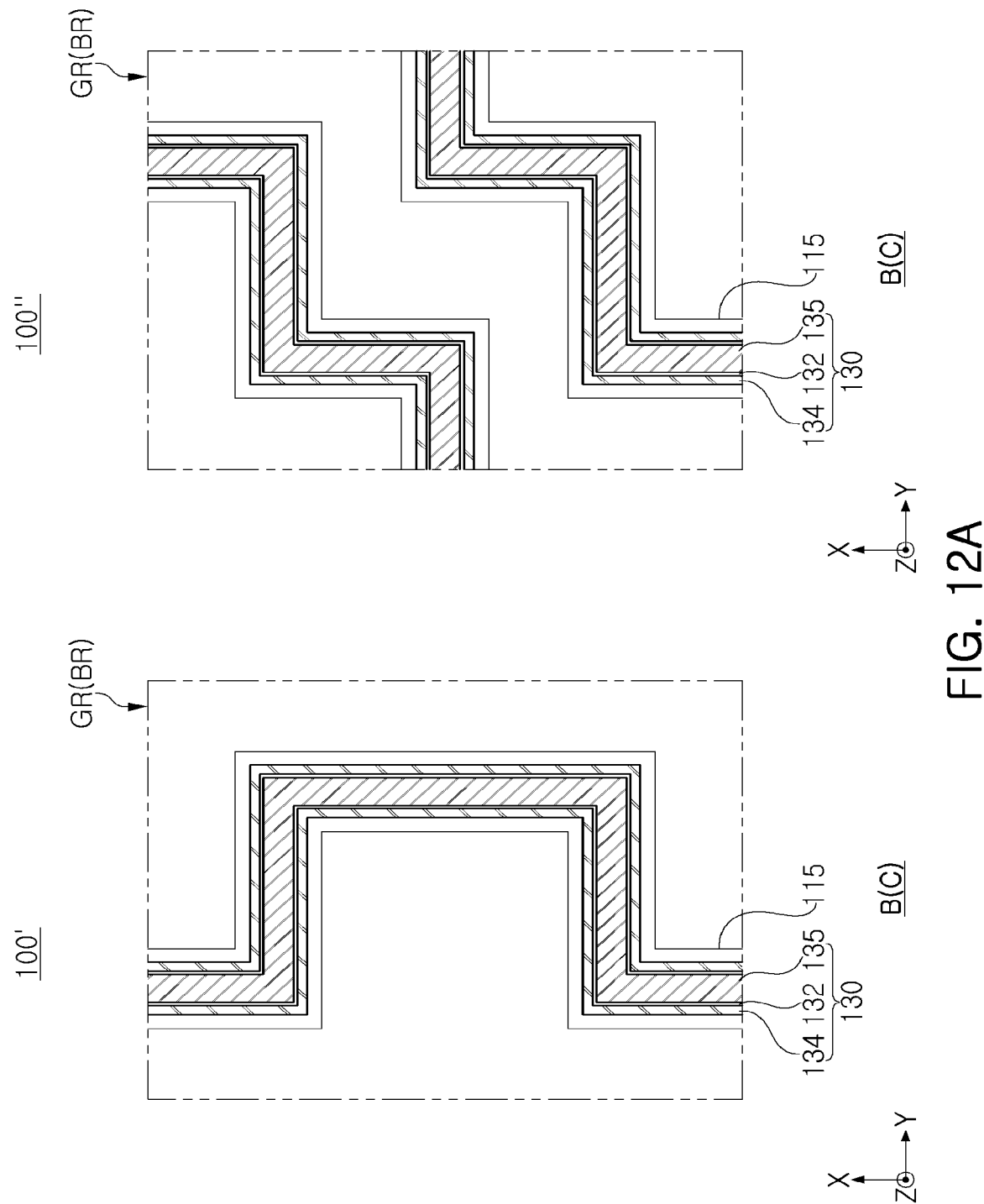
FIGS. 12A and 12B are enlarged plan views of a portion of a region of an example of a semiconductor device.

FIG. 12A is plan views of a semiconductor device according to an example embodiment, illustrating planar shapes of a first structure of the semiconductor device. The first structures 100' and 100' may have various planar shapes in example embodiments.

In a plan view, a first fin structure 115 of the first structure 100' may have a serration or serrated shape. The first gate structure 130 of the first structure 100" may also have a serration shape on the first fin structure 115.

In a plan view, the first fin structure 115 of the first structure 100" may have a zigzag shape. The first gate structure 130 of the first structure 100" may also have a zigzag shape on the first fin structure 115.

Figure 12B:
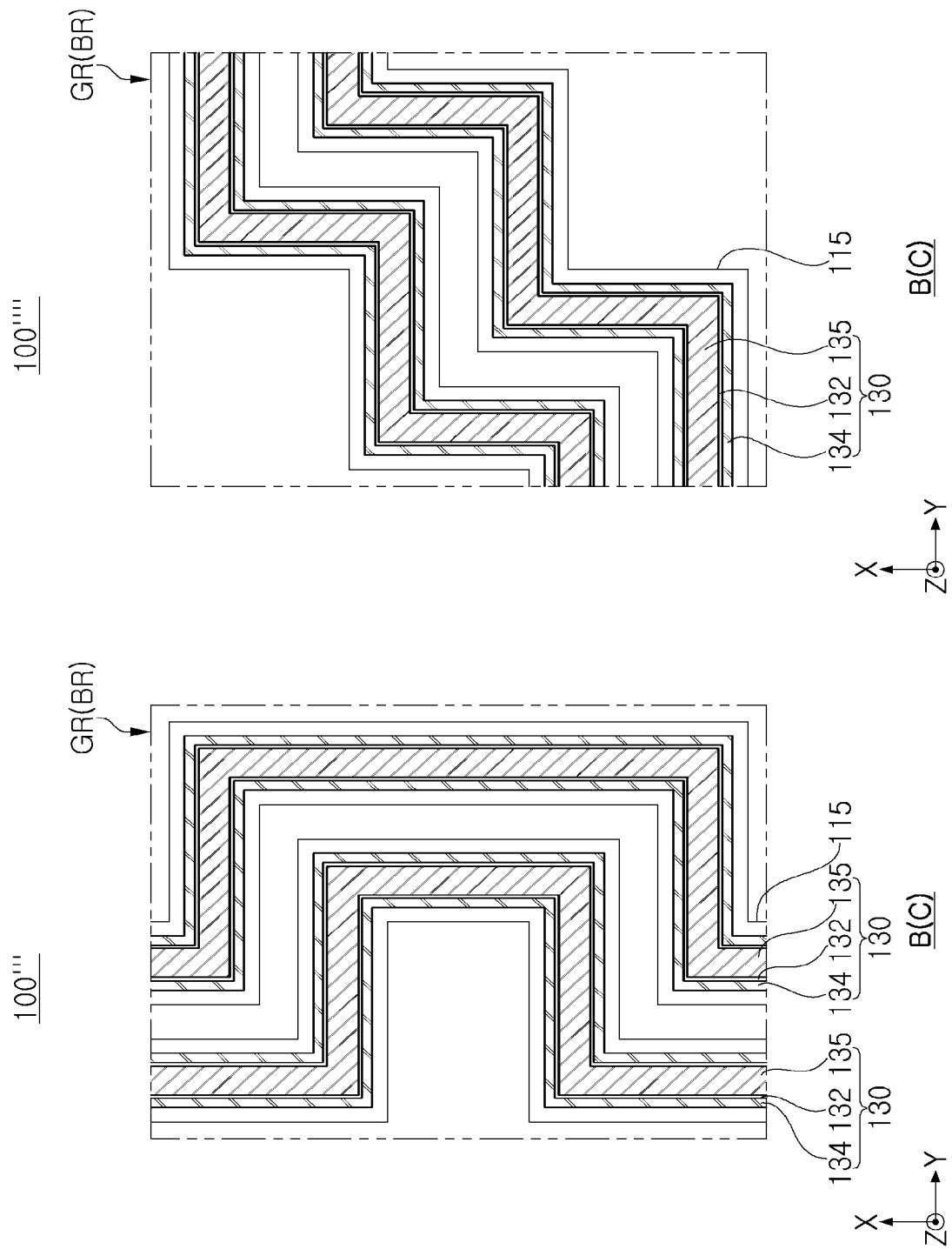

FIG. 12B is plan views of a semiconductor device according to an example embodiment, illustrating planar shapes of a first structure of the semiconductor device. The first structures 100''' and 100'''' may have various planar shapes in example embodiments.

In a plan view, the first fin structure 115 of the first structure 100''' may have a serration shape, and the first gate structure 130 of the first structure 100''' may have a serration shape on the first fin structure 115 and may be disposed in at least two rows.

In a plan view, the first fin structure 115 of the first structure 100'''' may have a zigzag shape. The first gate structure 130 of the first structure 100" may also have a zigzag shape on the first fin structure 115 and may be disposed in at least two rows.

Figure 13A:
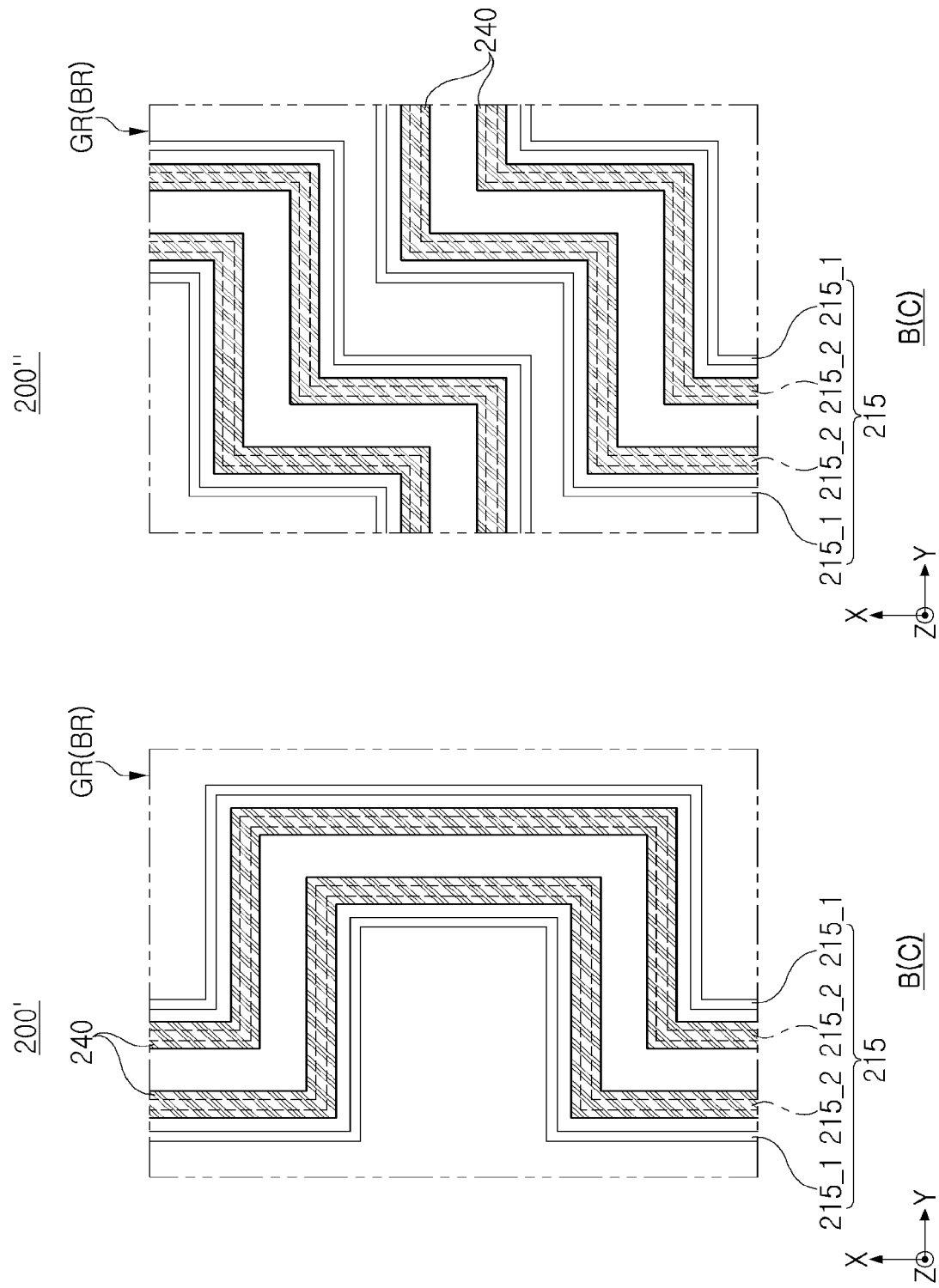
FIGS. 13A to 13C are enlarged plan views of a portion of a region of an example of a semiconductor device.

FIG. 13A is plan views of a semiconductor device according to an example embodiment, illustrating planar shapes of a second structure of the semiconductor device. The second structures 200' and 200" may have various planar shapes in example embodiments.

In a plan view, the second fin structures 215 of the second structure 200' may be disposed in at least four rows and may have a serration shape. The second contact structures 240 of the second structure 200' may also be disposed in at least two rows on inner fin patterns 215_2 of the second fin structures 215 and may have a serration shape.

In a plan view, the second fin structures 215 of the second structure 200" may be disposed in at least four rows and may have a zigzag shape. The second contact structures 240 of the second structure 200" may also be disposed in at least two rows on the inner fin patterns 215_2 of the second fin structures 215 and may have a zigzag shape.

Figure 13B:
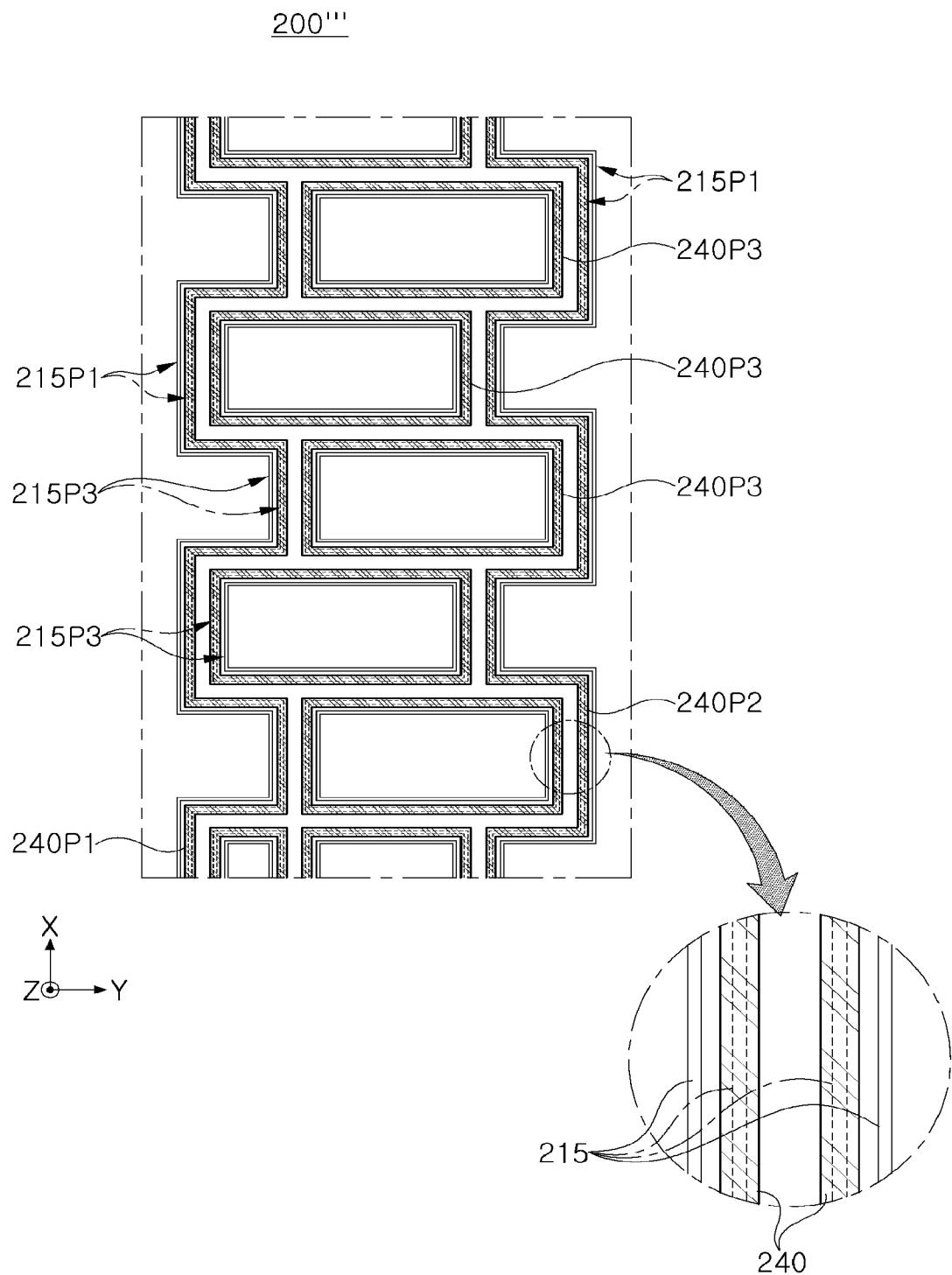

FIG. 13B is a plan view of a semiconductor device according to an example embodiment.

Referring to FIG. 13B, in a plane view, a second fin structure 215 of the second structure 200''' may have a first pattern 215P1 and a second pattern 215P2 each having a serration shape, and third patterns 215P3 in which rectangular regions may be alternately between the first pattern 215P1 and the second pattern 215P2. Each of the first pattern 215P1 and the second pattern 215P2 may include at least two second fin structures 215. Each of the third patterns 215P3 may include at least two second fin structures 215.

In a plan view, the second contact structure 240 of the second structure 200''' may also have a first contact pattern 240P1 and a second contact pattern 240P2 each having a serration shape, and a third contact pattern 240P3 in which rectangular regions are alternately between the second contact pattern 240P1 and the second contact pattern 240P2.

Figure 13C:
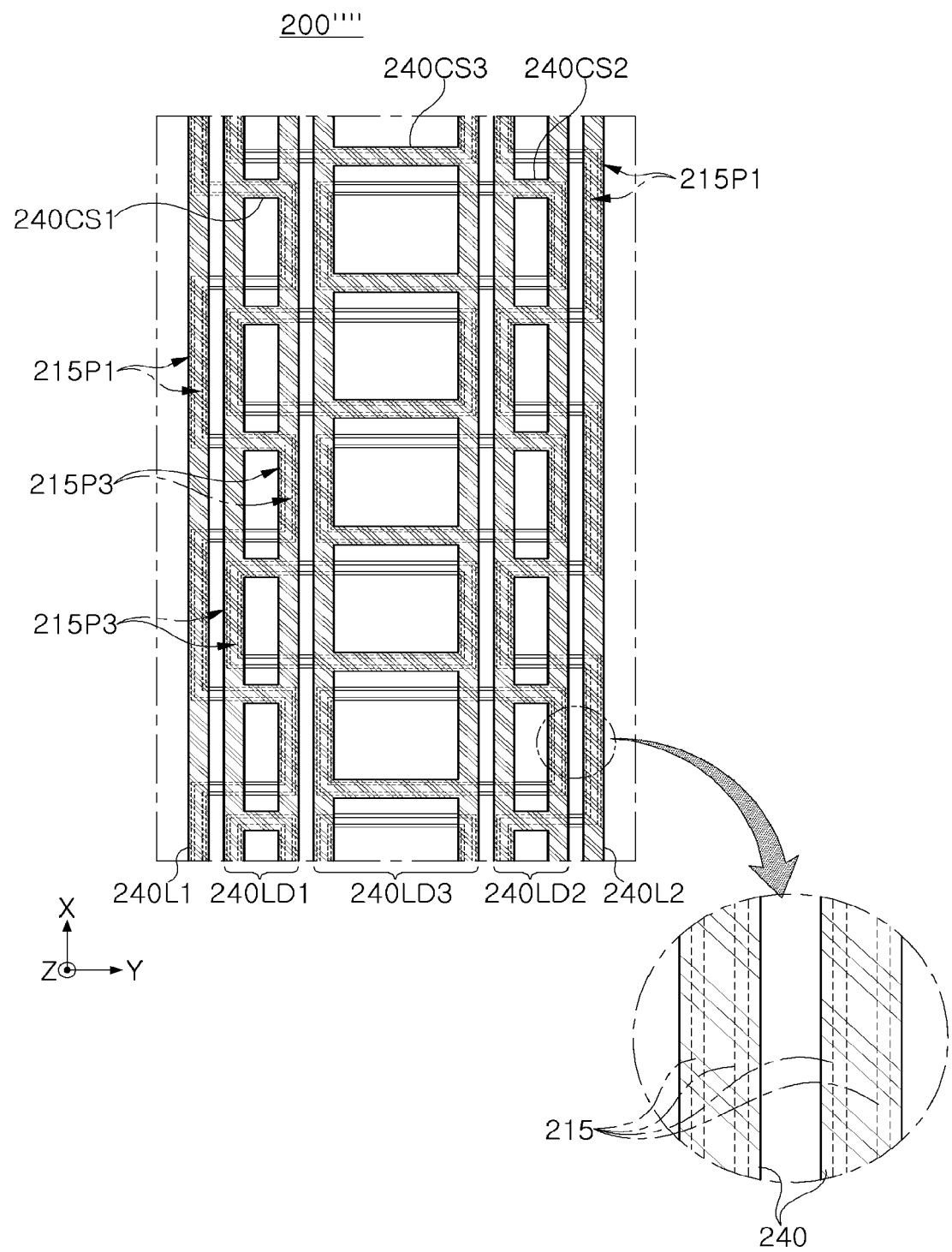

FIG. 13C is a plan view of a semiconductor device according to an example embodiment.

Referring to FIG. 13C, a second fin structure 215 of a second structure 200'''' may have a planar shape described in FIG. 13B.

In a plan view, the second contact structure 240 of the second structure 200'''' may include a first extension pattern 240L1 and a second extension pattern 240L2, extending in one direction, e.g., in the first direction (X).

In a plan view, the second contact structure 240 of the second structure 200″″ may include a first ladder pattern 240LD1, a second ladder pattern 240LD2, and a third ladder pattern 240LD3, between the first extension pattern 240L1 and the second extension pattern 240L2. The third ladder pattern 240LD3 may be between the first ladder pattern 240LD1 and the second ladder pattern 240LD2. Each of the first to third ladder patterns 240LD1, 240LD2, and 240LD3 may have a ladder shape in a plan view.

The third ladder pattern 240LD3 may have a width wider than widths of the first and second ladder patterns 240LD1 and 240LD2 in the second direction (Y). The first and second ladder patterns 240LD1 and 240LD2 may have substantially the same shape in a plan view.

The first ladder pattern 240LD1 may include first extension line portions extending (e.g., lengthwise) in the first direction (X) and first connection portions 240CS1 connecting the first extension line portions to each other and extending (e.g., lengthwise) in the second direction (Y).

The second ladder pattern 240LD2 may include second extension line portions extending in the first direction (X) and second connection portions 240CS2 connecting the second extension line portions to each other and extending in the second direction (Y).

The third ladder pattern 240LD3 may include third extension line portions extending in the first direction (X) and third connection portions 240CS3 connecting the third extension line portions to each other and extending in the second direction (Y).

The third connection portions 240CS3 may have a length longer than those of the first connection portions 240CS1 and the second connection portions 240CS in the second direction (Y).

Figure 14:
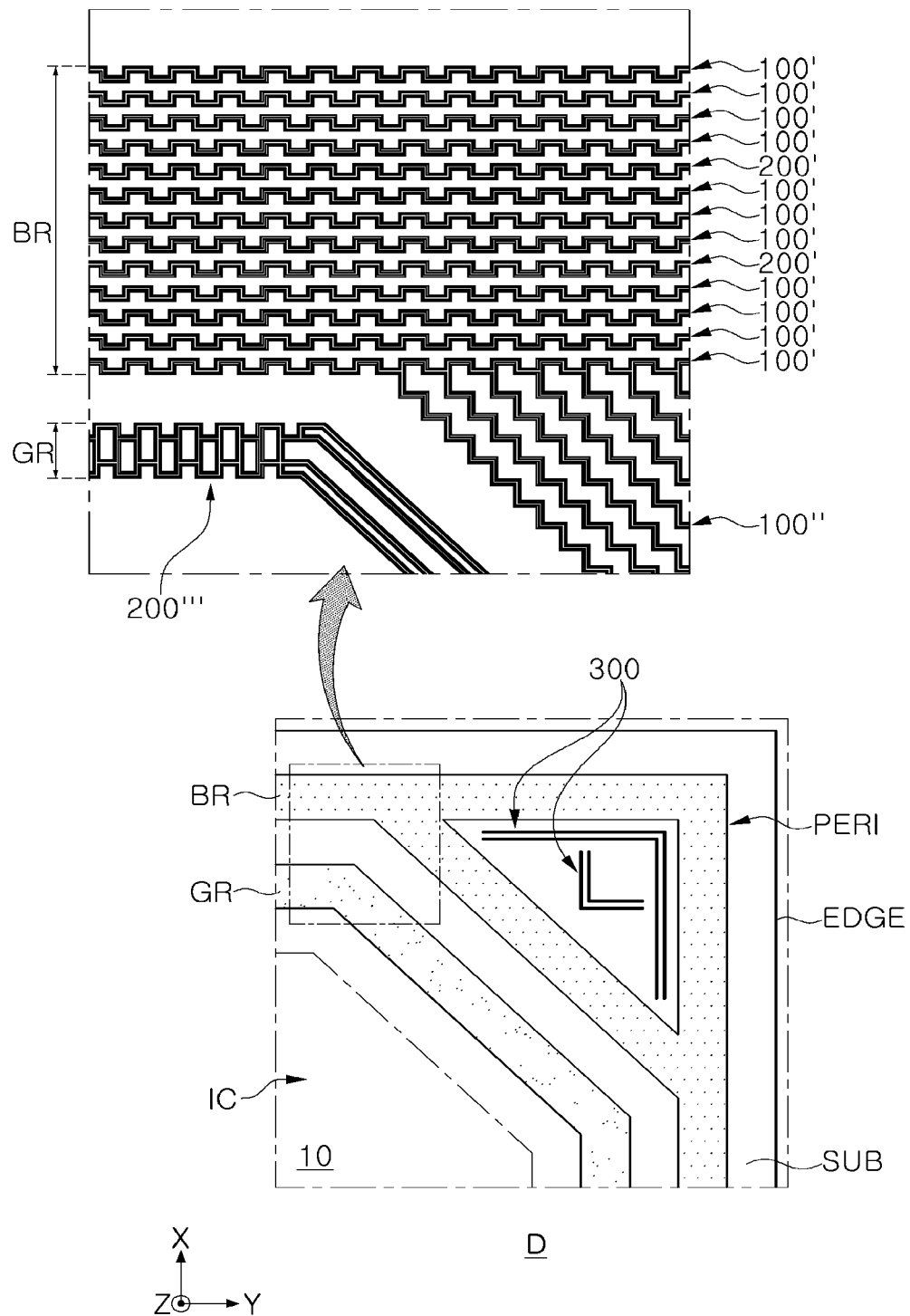
FIG. 14 is an enlarged plan view of a portion of a region of an example of a semiconductor device.

FIG. 14 is a plan view of a semiconductor device according to an example embodiment, illustrating region "D" illustrated in FIG. 1.

Referring to FIG. 14, a guard-ring region GR may have a shape extending in the first direction (X), being bent in a diagonal direction at one point, being bent again in the second direction (Y) at another point, and extending the second direction (Y). A plurality of second structures 200‴ may be on the guard-ring region GR. Referring to the enlarged diagram in FIG. 14, in the guard-ring region GR, a second fin structure 215 and a second contact structure 240 of the second structure 200‴ may have a repetitive pattern, and in the corner, the second fin structure 215 and the second contact structure 240 of the second structure 200‴ may extend linearly in a diagonal direction.

The blocking region BR may have a rectangular ring shape, and as illustrated in the enlarged diagram in FIG. 14, the blocking region BR may include a portion in which the first fin structure 115 and the first gate structure 130 of the first structure 100″ are disposed in a zigzag form. A plurality of first and second structures 100′ and 200′ may be on the blocking region BR.

The blocking region BR may have a triangular shape in a corner region of the semiconductor device 1, and an edge structure 300 may be further disposed in the triangular shape. The edge structure 300 may have the same vertical cross-sectional surface as that of the first structure 100 or the second structure 200. The edge structure 300 may have a linear shape extending in at least one direction within a triangular shape, and may have a serration shape similar to the first structure 100′ or the second structure 200′ in the blocking region BR.

FIGS. 15A to 15G are views of stages in a method of manufacturing a semiconductor device, according to an example embodiment.

Figure 15A:
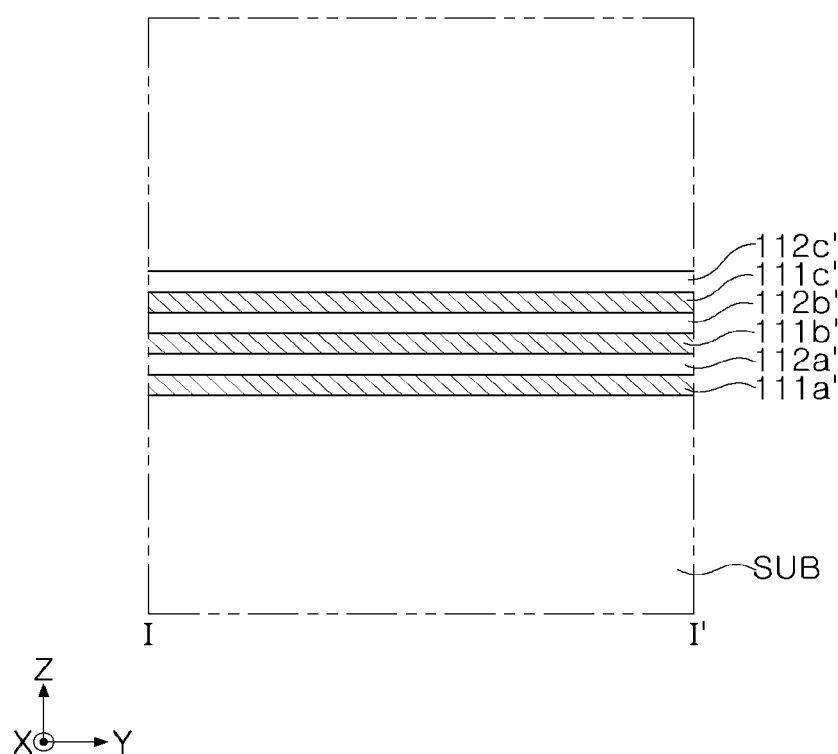
FIGS. 15A to 15G are views of stages in a method of manufacturing a semiconductor device, illustrating processes of manufacturing a semiconductor device in order, according to an example embodiment of the present disclosure.

Referring to FIG. 15A, first layers 111a, 111b, and 111c and second layers 112a, 112b, and 112c may be alternately stacked on a substrate SUB.

The first layers 111a, 111b, and 111c and the second layers 112a, 112b, and 112c may be formed in an entire region including a central region IC and a peripheral region PERI of the substrate SUB.

The first layers 111a, 111b, and 111c may be formed of a material having etch selectivity with respect to the second semiconductor layers 112a, 112b, and 112c. The first layers 111a, 111b, and 111c may include silicon germanium (SiGe), and the second semiconductor layers 112a, 112b and 112c may include silicon (Si).

Figure 15B:
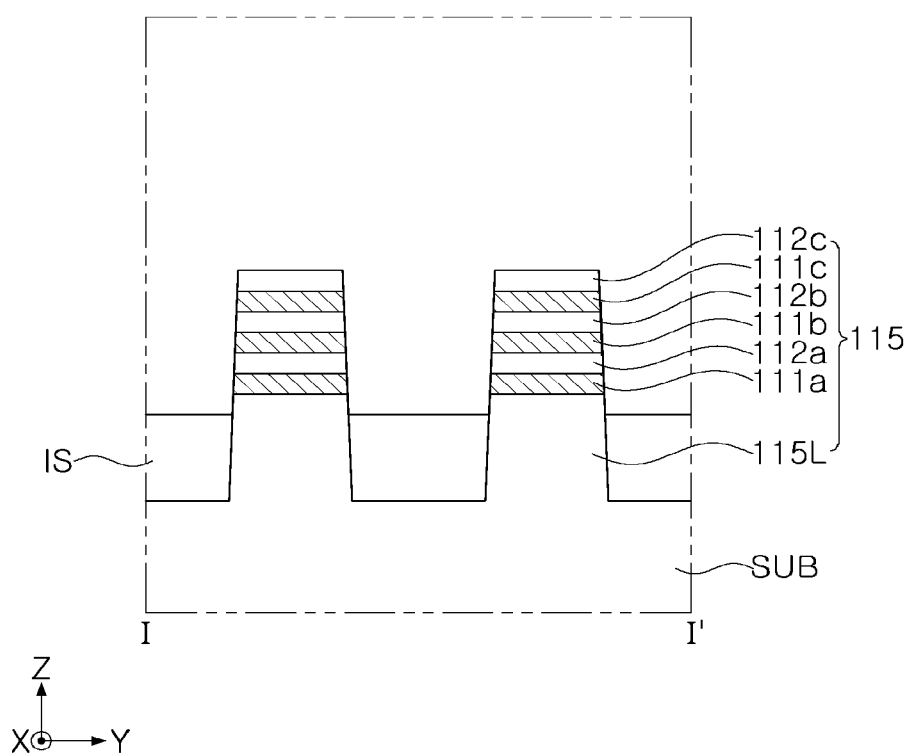

Referring to FIG. 15B, a first fin structure 115 may be formed by patterning the substrate SUB, the first layers 111a, 111b, and 111c, and the second layers 112a, 112b, and 112c.

Circuit fin patterns 15 may be formed on the central region IC of the substrate SUB, and the first fin structure 115 and the second fin structure 115 may be formed in the peripheral region PERI of the substrate SUB.

The circuit fin patterns 15, the first fin structure 115, and the second fin structure 215 may be defined by the device isolation region IS. The circuit fin patterns 15, the first fin structure 115, and the second fin structure 215 may extend from the substrate SUB and protrude further upwardly than the upper surface of the device isolation region IS.

In an example embodiment, the first layers 111a, 111b, and 111c and the second semiconductor layers 112a, 112b, and 112c may not be formed, and by patterning the substrate SUB, circuit patterns 15, a first fin structure 115, and a second fin structure 215 formed in a single fin shape may be formed.

Figure 15C:
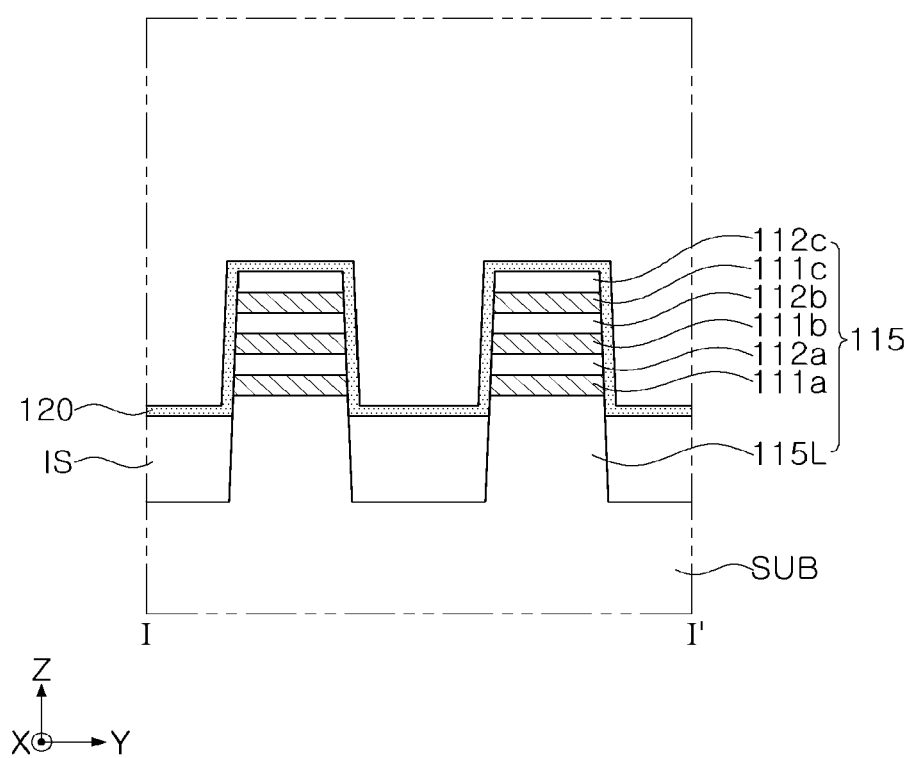

Referring to FIG. 15C, a first dielectric layer 120 may be formed on the substrate SUB.

On the peripheral region PERI of the substrate SUB, the second dielectric layer 220 may cover the second fin structure 215 such that the first dielectric layer 120 may cover the first fin structure 115. The first dielectric layer 120 and the second dielectric layer 220 may be the same layer. The first and second dielectric layers 120 and 220 may cover an upper surface of the device isolation region IS.

The first and second dielectric layers 120 and 220 may be formed of oxidation oxide or a deposited oxide.

Figure 15D:
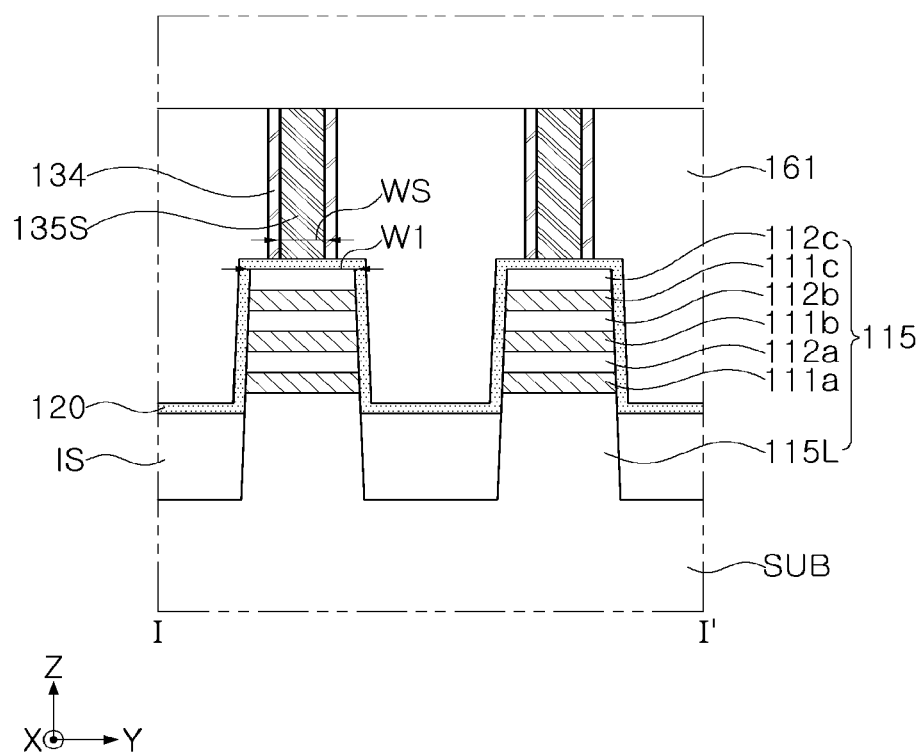

Referring to FIG. 15D, a sacrificial gate layer 135S and first gate spacer layers 134 may be formed on the first fin structure 115. A first insulating layer 161 covering the first dielectric layer 120 and the first gate spacer layers 134 may be formed.

The sacrificial gate layer 135S may be patterned using a mask pattern layer. The sacrificial gate layer 135S may include polysilicon. The first gate spacer layers 134 may be formed by forming a film having a uniform thickness along an upper surface and side surfaces of the sacrificial gate layer 135S and anisotropic-etching the film.

The sacrificial gate layer 135S may have a linear shape and may extend (e.g., lengthwise) in one direction. The sacrificial gate layer 135S may have a width (WS) narrower than that (W1) of the first fin structure 115 on the peripheral region PERI of the substrate SUB. The sacrificial gate layer 135S may intersect with the circuit fin patterns 15 on the center region IC of the substrate SUB. The sacrificial gate layer 135S on the central region IC may have a size narrower than a size of the sacrificial gate layer 135S on the peripheral region PERI.

After this process, on the center region IC of the substrate SUB, a portion of the circuit fin patterns 15 may be removed from both sides of the sacrificial gate layer 135S, and a selective epitaxial growth (SEG) process may be formed on an upper portion of the removed circuit fin patterns 15, thereby forming source/drain regions 40.

Figure 15E:
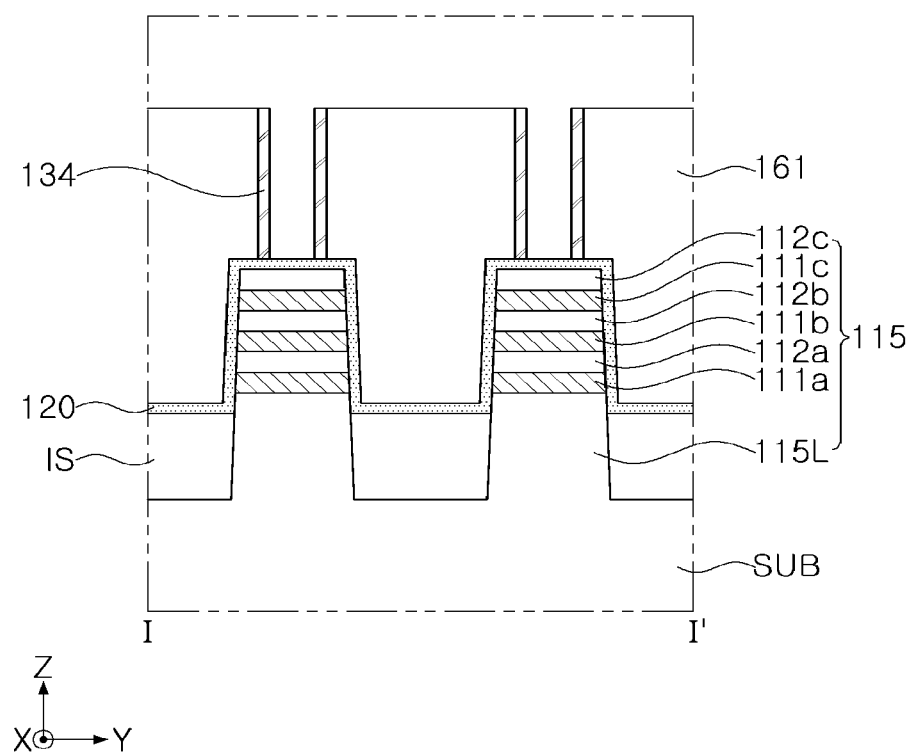

Referring to FIG. 15E, openings may be formed by removing the sacrificial gate layer 135S.

The sacrificial gate layer 135S may be selectively removed with respect to the first gate spacer layer 134, the first insulating layer 161, and the first dielectric layer 120.

On the central region IC of the substrate SUB, the sacrificial gate layer 135S may be removed such that the exposed dielectric layer may also be removed. On the central region IC of the substrate SUB, the first layers 111a, 111b, and 111c may be removed. On the peripheral region PERI of the substrate SUB, as the first layers 111a, 111b, and 111c are covered by the first dielectric layer 120 and the second dielectric layer 220 such that the first layers 111a, 111b, and 111c may not be removed. In an example embodiment, the first layers 111a, 111b, and 111c may be partially removed also on the peripheral region PERI of the substrate SUB.

Figure 15F:
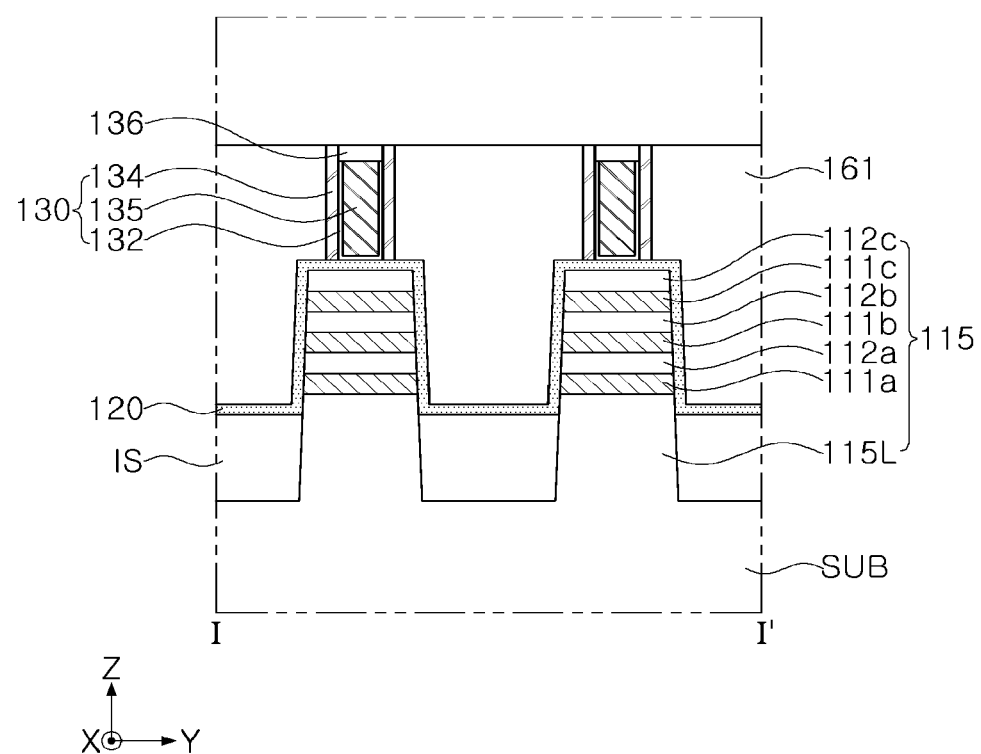

Referring to FIG. 15F, a first gate dielectric layer 132 and a first gate conductive layer 135 may be formed in the openings. A first gate capping layer 136 may be formed on the first gate conductive layer 135.

On the center region IC of the substrate SUB, the circuit gate dielectric layer 32 and the circuit gate electrode 35 may also be formed in the region from which the first layers 111a, 111b, and 111c are removed, thereby forming a transistor including an MBCFET™. In an example embodiment, the first gate dielectric layer 132 and the first gate conductive layer 135 may also be formed in the region from which the first layers 111a, 111b, and 111c are removed on the peripheral region PERI of the substrate SUB as well.

Figure 15G:
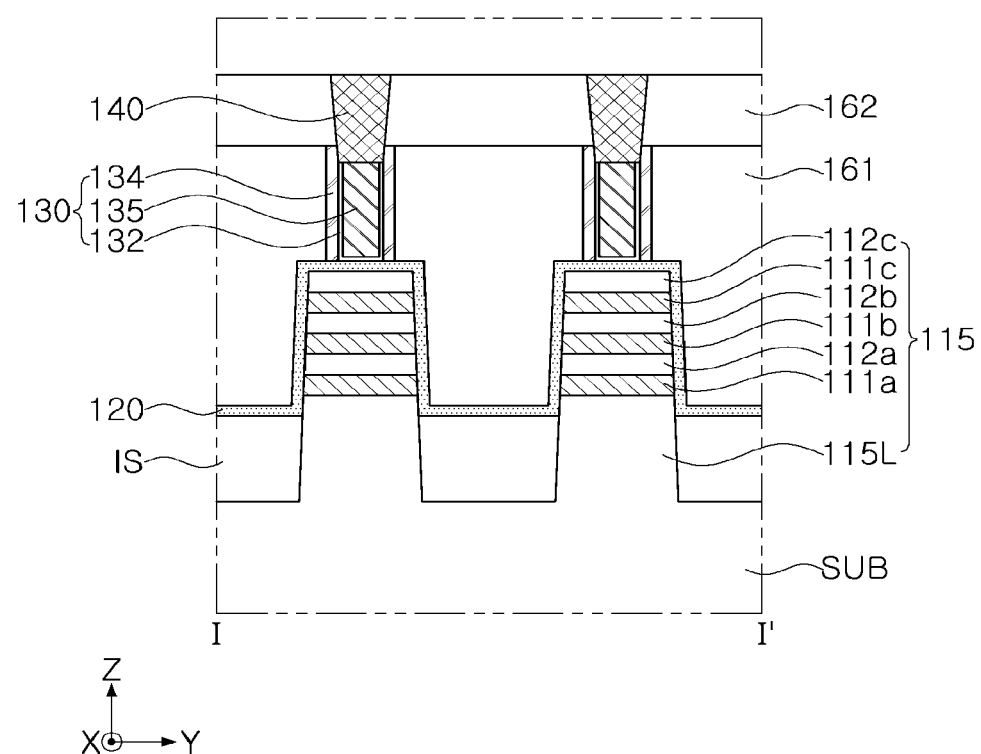

Referring to FIG. 15G, a second insulating layer 162 may be formed on the first insulating layer 161 and a first contact structure 140 may be formed.

Prior to this process, the first circuit contact structure CP1 may be formed on the source/drain regions 40 on the central region PERI of the substrate SUB. The first circuit contact structure CP1 may be formed together with the second contact structure 240 of the second structure 200 on the peripheral region PERI of the substrate SUB.

On the central region IC of the substrate SUB, a second circuit contact structure CP2 connected to the circuit gate electrode 35 may be formed. The second circuit contact structure CP2 may be formed together with the first contact structure 140 on the peripheral region PERI of the substrate SUB.

On the peripheral region PERI of the substrate SUB, the first contact structure 140 may penetrate through the first gate capping layer 136 and may be connected to the first gate conductive layer 135.

Thereafter, referring to FIGS. 2A to 3B, a third insulating layer 163 may be formed, and a first wiring layer 150 may be formed. Accordingly, the first structure 100 may be formed.

Wirings ML may be formed on the center region IC of the substrate SUB. A second wiring layer 250 may be formed on the peripheral region PERI of the substrate SUB.

A connection structure CM1 may be formed on the first circuit contact structure CP1 on the central region IC of the substrate SUB, and a connection structure 245 may be formed on the second contact structure 240 on the peripheral region PERI of the substrate SUB. Accordingly, the second structure 200 may be formed.

FIGS. 16A to 16E are views of stages in a method of manufacturing a semiconductor device, according to an example embodiment.

Figure 16A:
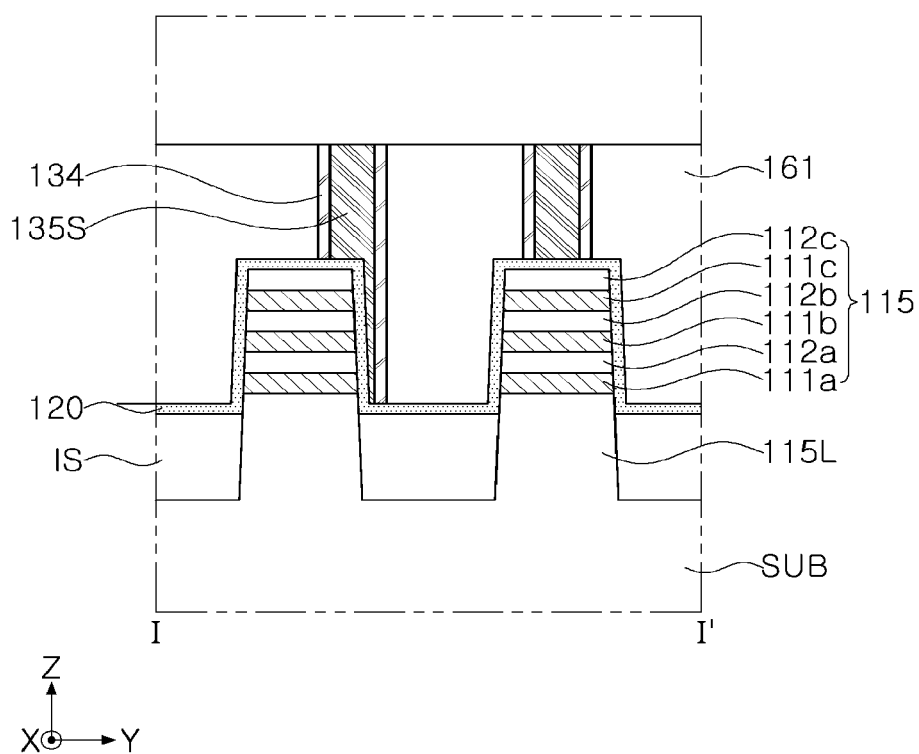
FIGS. 16A to 16D are views of stages in a method of manufacturing a semiconductor device, illustrating processes of manufacturing a semiconductor device in order, according to an example embodiment of the present disclosure.

Referring to FIG. 16A, at least one of the sacrificial gate layers 135S may be formed to cover the first dielectric layer 120 on the side surface of the first fin structure 115.

At least one of first gate spacer layers 134 may extend further downwardly than an upper surface of the first fin structure 115.

Figure 16B:
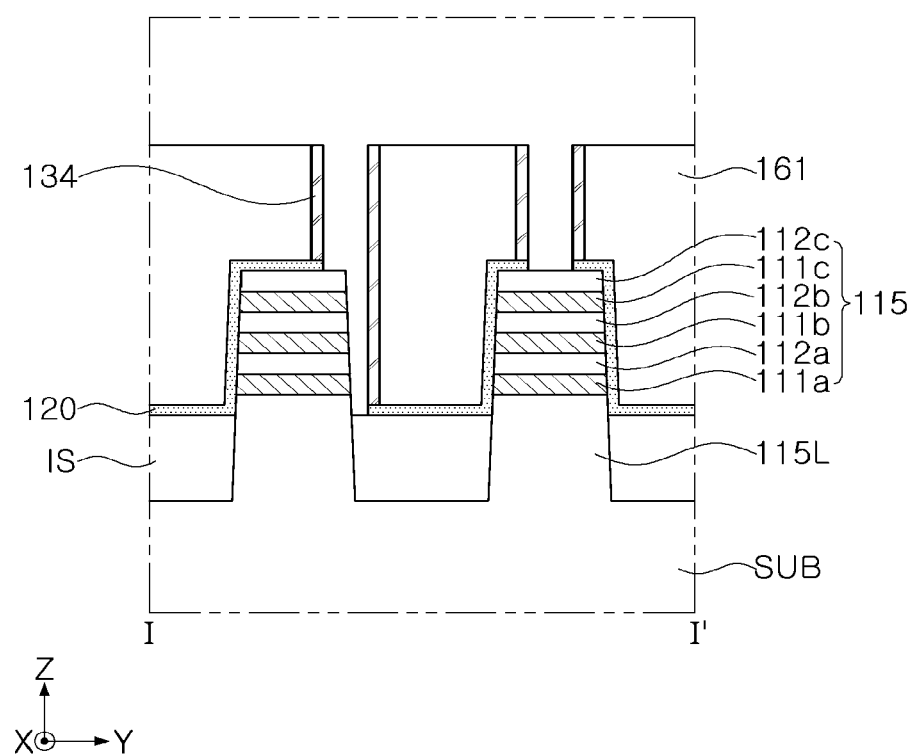

Referring to FIG. 16B, openings may be formed by removing the sacrificial gate layer 135S. The sacrificial gate layer 135S covering the first dielectric layer 120 on the side surface of the first fin structure 115 may be removed, and the first dielectric layer 120 may also be removed such that side surfaces of the first layers 111a, 111b, and 111c and the second semiconductor layers 112a, 112b, and 112c may be exposed.

Figure 16C:
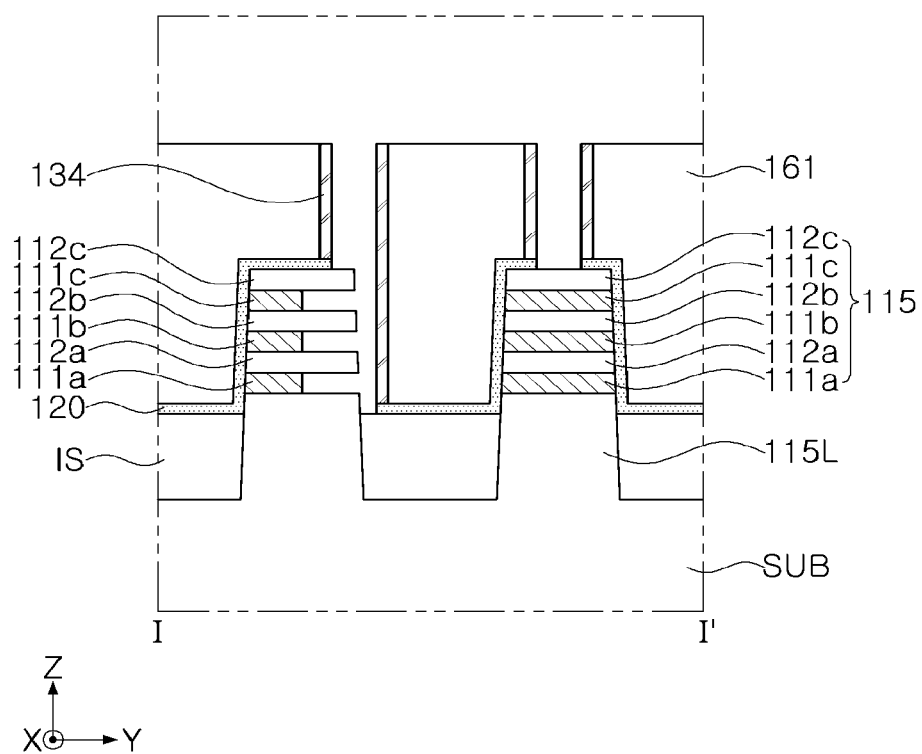

Referring to FIG. 16C, in a portion of the first fin structures 115, at least a portion of the first layers 111a, 111b, and 111c may be removed from a side surface exposed toward the openings. In the other portion of the first fin structures 115, the first layers 111a, 111b, and 111c may not be removed.

Figure 16D:
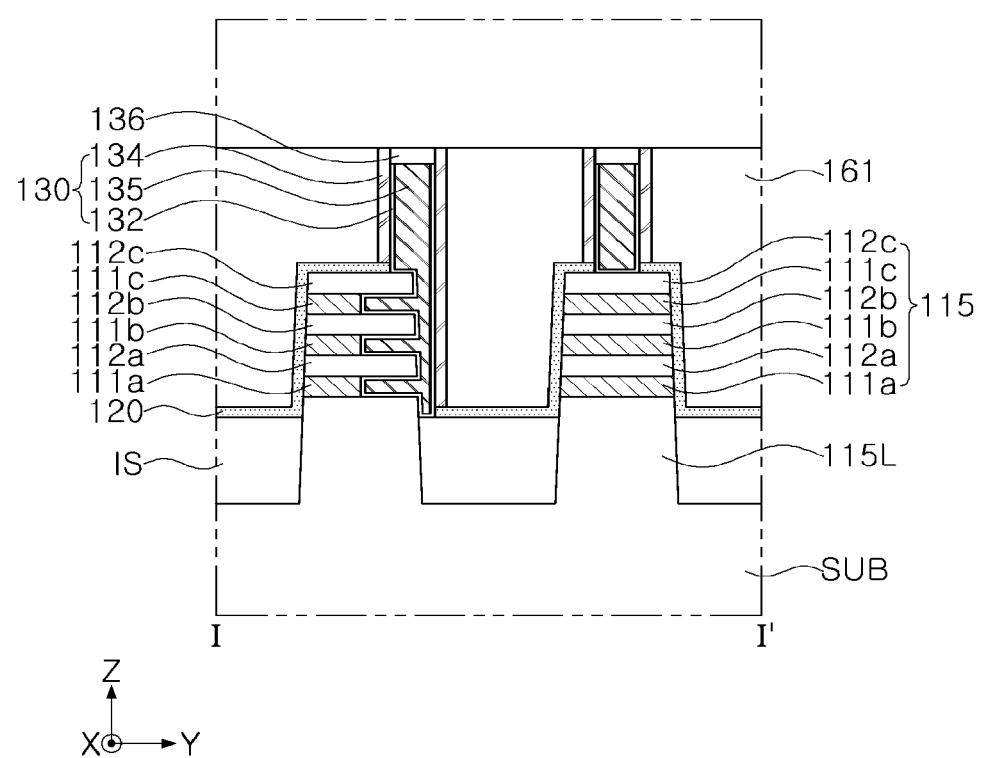

Referring to FIG. 16D, a first gate dielectric layer 132 and a first gate conductive layer 135 may be formed in the openings.

The first gate dielectric layer 132 and the first gate conductive layer 135 may also be formed in the region from which the first layers 111a, 111b, and 111c are removed.

Thereafter, referring to FIGS. 2A to 2C, and FIGS. 5A and 5B, a second insulating layer 162 may be formed, a first contact structure 140 may be formed, and a third insulating layer 163 may be formed, and a first wiring layer 150 may be formed. Accordingly, the first structure 100c illustrated in FIG. 5B may be formed.

By way of summation and review, when a wafer is cut, cracks may be created in an interlayer insulating layer, and the cracks could be transferred from an edge of the semiconductor device to an internal integrated circuit region, which may damage the semiconductor device. Also, moisture may permeate from the cut-out surface of the interlayer insulating layer such that the semiconductor device may be damaged. In an effort to help reduce or prevent this, structures surrounding the internal integrated circuit region may be formed.

One or more embodiments may provide a semiconductor device including structures which may help prevent cracks or moisture from permeating the internal integrated circuit region.

One or more embodiments may provide a semiconductor device which may help prevent a phenomenon in which a sacrificial gate layer may be lifted from a fin structure during a process of manufacturing a semiconductor device.

According to the aforementioned example embodiments, in a peripheral region of the semiconductor device, when a structure for protecting operational properties of the semiconductor device and blocking an external harmful environment is formed, a phenomenon in which the sacrificial gate layer is lifted from the fin structure may be prevented. The effect of preventing the lifting phenomenon may be obtained by configuring a width of the sacrificial gate layer to be narrower than a width of the fin structure.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   a substrate;
   a fin structure protruding from the substrate and including a plurality of first layers and a plurality of second layers alternately stacked on the substrate;
   a conductive layer on the fin structure;
   a first dielectric layer covering a lower surface, a first side surface, and a second side surface of the conductive layer;
   a capping layer on the conductive layer such that the conductive layer is vertically between the capping layer and the fin structure;
   a first spacer layer on the fin structure and on the first side surface of the conductive layer;
   a second spacer layer on the fin structure and on the second side surface of the conductive layer;
   wherein the fin structure, the conductive layer, the first dielectric layer, the capping layer, the first spacer layer, and the second spacer layer extend in a first direction, and
   wherein a width of the fin structure in a second direction crossing the first direction is greater than a distance between an inner side surface of the first spacer layer and an inner side surface of the second spacer layer.

2. The semiconductor device as claimed in claim 1, further comprising a second dielectric layer between the fin structure and the first dielectric layer.

3. The semiconductor device as claimed in claim 2, wherein a thickness of the second dielectric layer is greater than a thickness of the first dielectric layer.

4. The semiconductor device as claimed in claim 2, wherein:
   the first dielectric layer includes a high-k dielectric material, and
   the second dielectric layer includes silicon oxide.

5. The semiconductor device as claimed in claim 2, wherein the second dielectric layer has a first end contacting the first spacer layer and a second end contacting the second spacer layer.

6. The semiconductor device as claimed in claim 5, wherein a maximum distance between the first spacer layer and the second spacer layer is greater than a minimum distance between the first end of the second dielectric layer and the second end of the second dielectric layer.

7. The semiconductor device as claimed in claim 1, wherein the first spacer layer includes a lower portion overlapping the first dielectric layer in a third direction crossing the first direction and the second direction.

8. The semiconductor device as claimed in claim 1, wherein:
   each of the plurality of first layers includes a silicon-germanium layer, and
   each of the plurality of second layers includes a silicon layer.

9. The semiconductor device as claimed in claim 1, wherein at least one layer of the plurality of first layers includes a side surface of an inwardly concave shape.

10. The semiconductor device as claimed in claim 1, wherein at least one layer of the plurality of second layers includes a side surface of an outwardly convex shape.

11. The semiconductor device as claimed in claim 1, wherein:
    the substrate has a central region and a peripheral region surrounding the central region,
    the semiconductor device further comprises a transistor on the central region of the substrate, and
    the fin structure, the conductive layer, the first dielectric layer, the capping layer, the first spacer layer, and the second spacer layer are on the peripheral region.

12. A semiconductor device, comprising:
    a substrate;
    a fin structure including a semiconductor region protruding from the substrate and a stack structure on the semiconductor region;
    a conductive layer on the fin structure;
    a first dielectric layer covering a lower surface, a first side surface, and a second side surface of the conductive layer;
    a capping layer on the conductive layer such that the conductive layer is vertically between the capping layer and the fin structure;
    a first spacer layer on the fin structure and on the first side surface of the conductive layer;
    a second spacer layer on the fin structure and on the second side surface of the conductive layer;
    wherein the stack structure includes a plurality of first layers and a plurality of second layers alternately stacked on the semiconductor region, and
    wherein an uppermost surface of the fin structure includes a first upper portion, a second upper portion at a lower level than the first upper portion, and a third upper portion at a lower level than the second upper portion.

13. The semiconductor device as claimed in claim 12, wherein:
    the conductive layer vertically overlaps the first upper portion, and
    the first spacer layer vertically overlaps the second upper portion.

14. The semiconductor device as claimed in claim 12, wherein the upper surface of the fin structure further includes a first inclined portion between the first upper portion and the second upper portion, and a second inclined portion between the second upper portion and the third upper portion.

15. The semiconductor device as claimed in claim 12, further comprising:
    an isolation region on the substrate and a side surface of the semiconductor region;
    a first insulating layer on the isolation region and the third upper portion;
    an etch stop layer between the first insulating layer and the isolation region, between the first insulating layer and the stack structure, between the first insulating layer and the third upper portion, and between the first insulating layer and the first spacer layer; and
    a second insulating layer on the first insulating layer, the etch stop layer, and the capping layer.

16. The semiconductor device as claimed in claim 12, wherein:
    each of the plurality of first layers includes a silicon-germanium layer, and each of the plurality of second layers includes a silicon layer.

17. The semiconductor device as claimed in claim 12, wherein at least one layer of the plurality of first layers includes a side surface of an inwardly concave shape.

18. The semiconductor device as claimed in claim 12, wherein at least one layer of the plurality of second layers includes a side surface of an outwardly convex shape.

19. The semiconductor device as claimed in claim 12, wherein:
- the substrate has a central region and a peripheral region surrounding the central region,
- the semiconductor device further comprises a transistor on the central region of the substrate, and
- the fin structure, the conductive layer, the first dielectric layer, the capping layer, the first spacer layer, and the second spacer layer are disposed on the peripheral region.

20. A semiconductor device, comprising:
- a substrate having a central region and a peripheral region surrounding the central region;
- an integrated circuit structure on the central region of the substrate; and
- a first structure and a second structure on the peripheral region of the substrate, wherein:

the first structure includes:
- a first fin structure protruding from the substrate and including a plurality of first layers and a plurality of second layers alternately stacked on the substrate;
- a first conductive layer on the first fin structure;
- a first dielectric layer covering a lower surface, a first side surface, and a second side surface of the first conductive layer;
- a second dielectric layer between the first fin structure and the first dielectric layer; and
- a first capping layer on the first conductive layer such that the first conductive layer is vertically between the first capping layer and the first fin structure, and the second structure includes:
- a second fin structure protruding from the substrate and including a plurality of third layers and a plurality of fourth layers alternately stacked on the substrate;
- a second conductive layer on the second fin structure;
- a third dielectric layer covering a lower surface, a first side surface, and a second side surface of the second conductive layer;
- a fourth dielectric layer between the second fin structure and the third dielectric layer; and
- a second capping layer on the second conductive layer such that the second conductive layer is vertically between the second capping layer and the second fin structure, the first structure and the second structure extend in a first direction and spaced apart from each other in a second direction crossing the first direction, a distance between the first conductive layer and the second conductive layer is greater than a distance between the first fin structure and the second fin structure.

* * * * *